United States Patent
Krabbenborg et al.

(10) Patent No.: US 12,386,253 B2
(45) Date of Patent: Aug. 12, 2025

(54) METHOD FOR TRANSFERRING AN EMBOSSED STRUCTURE TO THE SURFACE OF A COATING, AND COMPOSITE EMPLOYABLE AS EMBOSSING MOLD

(71) Applicant: BASF Coatings GmbH, Münster (DE)

(72) Inventors: Sven Olle Krabbenborg, Münster (DE); Tim Buscher, Münster (DE); Joerg Duennewald, Münster (DE)

(73) Assignee: BASF COATINGS GMBH, Muenster (DE)

( * ) Notice: Subject to any disclaimer, the term of this patent is extended or adjusted under 35 U.S.C. 154(b) by 549 days.

(21) Appl. No.: 17/762,157

(22) PCT Filed: Sep. 24, 2020

(86) PCT No.: PCT/EP2020/076751
§ 371 (c)(1),
(2) Date: Mar. 21, 2022

(87) PCT Pub. No.: WO2021/058658
PCT Pub. Date: Apr. 1, 2021

(65) Prior Publication Data
US 2022/0373881 A1 Nov. 24, 2022

(30) Foreign Application Priority Data
Sep. 25, 2019 (EP) .................... 19199453

(51) Int. Cl.
*B05D 5/00* (2006.01)
*C09D 183/06* (2006.01)
*G03F 7/00* (2006.01)

(52) U.S. Cl.
CPC ............. *G03F 7/0002* (2013.01); *B05D 5/00* (2013.01); *C09D 183/06* (2013.01)

(58) Field of Classification Search
CPC ........ G03F 7/0002; C09D 183/06; B05D 5/00
See application file for complete search history.

(56) References Cited

U.S. PATENT DOCUMENTS 9,778,564 B2   10/2017   Kobayashi et al.
10,308,768 B2   6/2019   Nees et al.
(Continued)

FOREIGN PATENT DOCUMENTS

DE   102007062123 A1   6/2009
EP   0092269 A1   10/1983
(Continued)

OTHER PUBLICATIONS

WO 2012/070833A2 English Translated (Year: 2012).*
(Continued)

*Primary Examiner* — Gordon Baldwin
*Assistant Examiner* — Mohammad Mayy
(74) *Attorney, Agent, or Firm* — Armstrong Teasdale LLP

(57) ABSTRACT

Disclosed herein is a method for transferring an embossed structure to at least a part of a surface of a coating composition (C2a) using a composite (S1C1) including a substrate (S1) and an at least partially embossed and at least partially cured coating (C1) upon following steps (1), (2-i) and (3-i) or (2-ii) and (3-ii), and also at least step (4) and optionally step (5-i) or (5-ii), where the coating composition (C1a) is a radiation-curable coating composition of defined constitution and the composite (S1C1) is used as embossing mold (e2) of an embossing tool (E2).

16 Claims, 4 Drawing Sheets

(56) References Cited

U.S. PATENT DOCUMENTS

Figure 1:
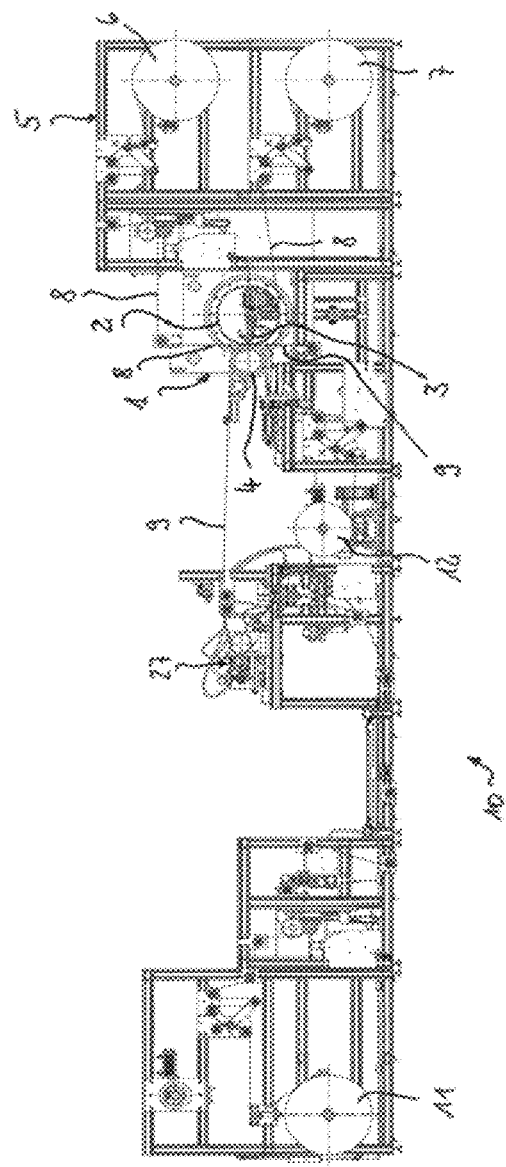

| | | |
|---|---|---|
| 2006/0214326 A1 | 9/2006 | Kim et al. |
| 2007/0204953 A1 | 9/2007 | Lin |
| 2012/0094072 A1* | 4/2012 | Aramaki .................. B22F 7/04 |
| | | 428/141 |
| 2013/0101791 A1* | 4/2013 | Hitschmann .......... B29C 59/022 |
| | | 428/141 |
| 2016/0082688 A1 | 3/2016 | Nakai et al. |
| 2021/0023873 A1 | 1/2021 | Kues et al. |
| 2021/0129415 A1 | 5/2021 | Kues et al. |

FOREIGN PATENT DOCUMENTS

| | | |
|---|---|---|
| EP | 1135267 B1 | 3/2003 |
| EP | 2146805 B1 | 11/2011 |
| EP | 3178653 A1 | 6/2017 |
| JP | 2012148481 A | 8/2012 |
| KR | 20090068490 A | 6/2009 |
| RU | 2286883 C2 | 11/2006 |
| RU | 2449881 C2 | 5/2012 |
| WO | 1990015673 A1 | 12/1990 |
| WO | 2012006207 A1 | 1/2012 |
| WO | WO-2012070833 A2 * | 5/2012 ............... C09D 4/00 |
| WO | 2015154866 A1 | 10/2015 |
| WO | 2016090395 A1 | 6/2016 |
| WO | 2016171221 A1 | 10/2016 |
| WO | 2019185832 A1 | 10/2019 |
| WO | 2019185833 A1 | 10/2019 |

OTHER PUBLICATIONS

"Large-Area Roll-to-Roll and Roll-to-Plate Nanoimprint Lithography: A Step toward High-Throughput Application of Continuous Nanoimprinting", Se Hyun Ahn and L. Jay Guo, vol. 3, No. 8, 2304-2310, (Year: 2009).*

International Search Report and Written Opinion for corresponding PCT/EP2020/076751 mailed Jan. 22, 2021; 12 Pages.

European Search Report for EP Patent Application No. 19199453.2, Issued on Mar. 19, 2020, 3 pages.

* cited by examiner

METHOD FOR TRANSFERRING AN EMBOSSED STRUCTURE TO THE SURFACE OF A COATING, AND COMPOSITE EMPLOYABLE AS EMBOSSING MOLD

CROSS-REFERENCE TO RELATED APPLICATIONS

This application is a U.S. National Phase Application of International Patent Application No. PCT/EP2020/076751, filed Sep. 24, 2020, which claims priority to European Patent Application No. 19199453.2, filed Sep. 25, 2019, each of which is hereby incorporated by reference herein.

FIELD OF THE INVENTION

The present invention relates to a method for transferring an embossed structure to at least a part of a surface of a coating composition (C2a) using a composite (S1C1) comprising a substrate (S1) and an at least partially embossed and at least partially cured coating (C1) upon following steps (1), (2-i) and (3-i) or (2-ii) and (3-ii), and also at least step (4) and optionally step (5-i) or (5-ii), wherein the coating composition (C1a) is a radiation-curable coating composition of defined constitution and the composite (S1C1) is preferably used as embossing mold (e2) of an embossing tool (E2).

PRIOR ART

In many applications within industry it is nowadays customary to provide workpieces on their surface with structures whose structural features are in the micrometer range or even in the nanometer range. Such structures are also referred to as microstructures (structures with features in the micrometer range) or nanostructures (structures with features in the nanometer range). Such structures are used, for example, to influence optical, bionic and/or tactile qualities of materials surfaces. Structures of this kind are also referred to as embossments, embossed structures or structured surfaces.

One common method to produce such structured surfaces is to transfer these structures into a coating material. Transfer of the structures into the coating material is frequently achieved with an embossing operation wherein a mold containing the microstructures and/or nanostructures to be formed, in a negative form, is brought into contact with and impressed into the coating material. The coating material is typically cured in situ to obtain permanently formed structures.

WO 90/15673 A1 describes a method wherein a radiation-curable coating material is applied to a film or to an embossed mold with the negative desired embossed structure, and the embossing tool is then printed onto the foil, to the foil provided with the coating material. While the radiation-curable coating material is still located between foil and embossing tool, curing is carried out and then, following removal of the tool, a film is obtained which is provided with a radiation-cured coating material that comprises the desired positive feature structure. European patent EP 1 135 267 B1as well describes a method of this kind wherein a curable coating material is applied to the substrate surface for decoration, and a corresponding embossed mold with negative pattern is pressed into the uncured coating layer. Thereafter, the coating layer is cured and the embossing mold is subsequently removed. EP 3 178 653 A1 discloses an article comprising a flexible fabric having a textured surface for use in the replicative casting of curable systems. The fabric may have polymer layers which can be produced by using mono- and polyfunctional acrylates.

U.S. Pat. No. 9,778,564 B2 discloses an imprint material which includes a component which necessarily comprises a (meth)acrylamide structural unit, and also a further component having 2 to 6 polymerizable groups, this component also having alkylene oxide units. Following application of this material to a substrate, the film obtained therefrom can be provided with a pattern in the course of its curing by means of UV radiation, using a nickel embossing tool.

US 2007/0204953 A1 discloses a method for patterning adhesive resins, which provides in succession for application of a curable layer of adhesive resin to a substrate, the application of a structured pattern to said layer, and, subsequently, the curing of the layer, so as to give a substrate provided with a cured adhesive resin that comprises the desired patterning.

WO 2015/154866 A1 relates to a method for producing a substrate with a structured surface. In that case, first of all, a first UV-curing coating is applied to the substrate and is cured. Atop this cured coating is then applied, as embossing varnish, a second UV-curing coating, which is embossed to generate a microstructure and is subsequently cured.

DE 10 2007 062 123 A1 describes a method for applying an embossing varnish such as, for example, a UV-crosslinkable embossing varnish to a carrier film, structuring the embossing varnish in the micrometer range, and curing the embossing varnish applied to the film to give an embossed film whose microstructure is subsequently modeled by deposition of a metal on the embossed surface, in other words, by metallizing of the film. A disadvantage of such modeling by means of subsequent metallization, however, is a resultant unwanted reduction in the quality of modeling.

EP 2 146 805 B1 describes a method for producing a material having a textured surface. The method involves providing a substrate with a curable coating, contacting said coating with a texturing medium for embossing, and then curing the coating embossed in this way and removing it from the texturing medium. The texturing medium comprises a surface layer which contains 20% to 50% of an acrylic oligomer, 15% to 35% of a monofunctional monomer, and 20% to 50% of a polyfunctional monomer. WO 2016/090395 A1 and ACS Nano Journal, 2016, 10, pages 4926 to 4941 describe similar methods, with the explicit teaching in each case that in order to produce the surface layer of the texturing medium, large parts of three-fold ethoxylated trimethylolpropane triacrylate (TMP(EO)$_3$TA) ought to be used in order to allow the generation of a comparatively hard mold of the texturing medium. According to WO 2016/090395 A1, moreover, the coating composition used for producing the surface layer must also necessarily include a structural unit which has at least two thiol groups, such as trimethylolpropane tris(3-mercaptopropionate), for example. The use of such thiols in corresponding coating material compositions is often disadvantageous, however, since such compositions do not always have sufficient stability on storage and since coatings produced from them lack adequate weathering stability. A further factor is an odor nuisance, resulting from the use of the thiols, which of course is likewise undesirable.

KR 2009/0068490 A relates to a method for transferring an embossed structure of fine patterns of dozens of nanometers using a polymer mold, wherein the polymer mold is composed of i) acrylate selected from silicone (meta) acrylate and fluorine (meta) acrylate, ii) a specific multifunctional urethane (meta) acrylate, iii) UV curable monomer, and (iv) photoinitiator as well as a manufacturing method thereof, to improve separation of the polymer mold from the substrate with no swelling by organic solvent, the polymer mold having an excellent flexibility, mechanical strength and durability, compared to molds prepared from PDMS (polydimethylsiloxane).

Lastly, applications WO2019185832A1 and WO2019185833 A1 describe a method for transferring an embossed structure to a surface of a coating composition (B2a) using a composite (F1B1) composed of a substrate (S1) and an embossed and cured coating (B1) according specific steps, wherein the coating composition (B1a) used for producing (B1) of the composite (F1B1) is a radiation-curable coating composition of defined constitution, and also to a use of the composite (F1B1) as embossing die (p2) of an embossing tool (P2) for transferring an embossed structure to at least a part of a surface of a coating composition (B2a).

The embossing methods known from the prior art, such as in particular the methods described in EP 2 146 805 B1, WO 2016/090395 A1, and ACS Nano Journal, 2016, 10, pages 4926 to 4941 are not always sufficiently capable, however, of transferring embossments, particularly in the micrometer range and/or in the nanometer range, i.e. microstructures and/or nanostructures, particularly not without lowering the accuracy of molding to an unacceptable degree in the case of such a transfer. At the same time, the embossments are not always adequately replicated or, as in applications WO2019185832A1 and WO2019185833 A1, a high degree of replication and destruction free separation of embossed and cured coating can only be obtained upon allowing the composite used as embossing mold to age for a specific time and direct separation after curing of embossing mold and embossed and cured coating.

There is therefore a need for an embossing method which does not have the disadvantages stated above.

Object

Therefore, an object of the present invention is to provide a method for transferring embossed structures to coating compositions, and to substrates comprising such coating compositions, and more particularly a process of this kind which allows the transfer of corresponding microstructures and/or nanostructures and which permits sufficient molding accuracy and a high degree of success of replication in the transfer of the embossed structures, also over larger areas of a substrate, so that embossing is not accompanied by loss of any depth of modulation, and which enables in particular the generation of a very largely reusable embossing mold for transferring the embossed structures, and/or can be carried out using an embossing mold of this kind. At the same time, it is to be possible for the embossing structures that are to be transferred to be replicated to an extremely high degree, without the method featuring any disadvantages brought about in particular by unwanted or inadequate properties on the part of the coatings and coating compositions used, such as inadequate adhesion, in particular an inadequate adhesion in terms of repellence of the coating composition to be embossed from the mold by de-wetting of the coating composition to be embossed due to mismatched surface energies, resulting in a decreased mold filling and loss of modulation, where especially a good separation of embossing mold and embossed and cured coating is provided independent from the time passed after producing the embossing mold and bringing into contact of embossing mold and to be embossed coating composition. Furthermore, the molding accuracy over the entire width of the embossing mold is to be improved.

Technical Solution

This problem is solved by the subject matter claimed in the claims and also by the preferred embodiments of that subject matter as described hereinafter.

A first subject of the present invention is therefore a method for transferring an embossed structure to at least a part of a surface of a coating composition (C2a) using a composite (S1C1), said method comprising at least the steps (1), (2-i) and (3-i) or (2-ii) and (3-ii), and also at least step (4) and optionally step (5-i) or (5-ii), specifically:

(1) providing a composite (S1C1) composed of a substrate (S1) and an at least partially embossed and at least partially cured coating (C1);
and
(2-i) applying at least one coating composition (C2a) to at least a part of a surface of a substrate (S2) to provide composite (S2C2a);
(3-i) applying the composite (S1C1) to at least a part of the coating composition (C2a) of the composite (S2C2a) to provide composite (S1C1C2aS2);
or
(2-ii) applying at least one coating composition (C2a) to at least a part of an at least partially embossed and at least partially cured surface of composite (S1C1) and at least partially embossing the coating composition (C2a) using composite (S1C1) to provide composite (S1C1C2a);
(3-ii) optionally applying a substrate (S2) to at least a part of the surface, formed by coating composition (C2a), of the composite (S1C1C2a) to give a composite (S1C1C2aS2);
and
(4) at least partially curing the at least partially embossed coating composition (C2a) optionally applied to a substrate (S2) which throughout the duration of the at least partial curing is in contact with the composite (S1C1) to provide a composite (S1C1C2) or (S1C1C2S2);
and
(5-i) optionally removing composite (C2S2) within the composite (S1C1C2S2) from the composite (S1C1) to restore the composite (S1C1) provided in step (1);
or
(5-ii) optionally removing coating (C2) within the composite (S1C1C2) from the composite (S1C1) to restore the composite (S1C1) provided in step (1);
wherein a coating composition (C1a) used for producing the at least partially embossed and at least partially cured coating (C1) of the composite (S1C1) used in step (1) and restored in step (5-i) or step (5-ii) is a radiation-curable coating composition, comprising (a) 1 to 45 weight % of at least one crosslinkable polymer and/or oligomer,
(b) 40 to 95 weight % of at least one reactive diluent,
(c) 0.01 to 15 weight % of at least one photoinitiator, and
(d) 0 to 5 weight % of at least one additive;
where (i) the stated total amounts of the components (a), (b), (c), and (d) are each based on the total weight of the coating composition (C1a), and (ii) the total amounts of all components present in the coating composition (C1a) add up to 100 weight %;
wherein the at least one crosslinkable polymer and/or oligomer (a) comprises a total amount of at least 25 weight %, preferably at least 50 weight %, more preferably at least 90 weight %, very preferably 100 weight %, based on the total weight of all crosslinkable polymer and/or oligomer comprised in the coating composition (C1a), of at least one silicone (meth) acrylate oligomer.

It has surprisingly been found that the method of the invention enables the transfer of embossed microstructures and/or nanostructures, in particular in a range from 10 nm to 1000 μm structure width and in a range from 1 nm to 1000 μm structure depth, to a coating composition that is to be embossed, allowing a very high degree of successful replication independent from the time passed since producing the composite (S1C1) and application of the coating composition (C2a) thereto, and the time passed between embossing and curing of the coating composition (C2a) applied to such a composite (S1C1) favorably used as embossing mold, without loss of a high replication quality suffering from less mold filling, with the composite (S1C1) preferably used as embossing mold (e2) of an embossing tool (E2) having an improved layer thickness homogeneity over the width of the embossing mold allowing a more homogeneous application of pressure over the composite (S1C1) if applied.

In this context it has in particular been surprisingly found that the method of the invention enables transfer of embossed structures with a very high molding accuracy and a high level of replication success over the entire width of the mold with a composite (S1C1) which is obtainable by coating of a radiation-curable coating composition (C1a) onto a preferably moving substrate (S1) and which is favorably used as embossing mold (e2) of an embossing tool (E2).

It has further surprisingly been found that the method of the invention can be applied so advantageously because the coating (C1) on the substrate (S1) is distinguished by very good adhesion and very good separation behavior independent from the age of the composite (S1C1) and time passed since embossing and curing coating composition (C2), and for this reason as well a corresponding composite (S1C1) can be employed very effectively as embossing mold (e2).

It has further been surprisingly found that the composite (S1C1) employable as embossing mold (e2) of the embossing tool (E2) within the method of the invention can be reused for transferring the embossed structures such as microstructures and/or nanostructures, particularly in the form of a continuous embossing mold, this being advantageous for reasons of economics. Surprisingly, moreover, this composite (S1C1), which is present preferably in the form of a continuous embossing mold (e2), not only is reusable and therefore multiply utilizable but also can be produced inexpensively and quickly on large industrial scale.

A further subject of the present invention is therefore also a composite (S1C1) which is composed of a substrate (S1) and of an at least partially embossed and at least partially cured coating (C1), and which is producible by at least partially curing a coating composition (C1a), applied to at least a part of a surface of the substrate (S1) and at least partially embossed, by radiation curing, wherein the coating composition (C1a) is a radiation-curable coating composition, comprising (a) 1 to 45 weight % of at least one crosslinkable polymer and/or oligomer,
(b) 40 to 95 weight % of at least one reactive diluent,
(c) 0.01 to 15 weight % of at least one photoinitiator, and
(d) 0 to 5 weight % of at least one additive;

where (i) the stated total amounts of the components (a), (b), (c), and (d) are each based on the total weight of the coating composition (C1a), and (ii) the total amounts of all components present in the coating composition (C1a) add up to 100 weight %;

wherein the at least one crosslinkable polymer and/or oligomer (a) comprises a total amount of at least 25 weight %, preferably at least 50 weight %, more preferably at least 90 weight %, very preferably 100 weight %, based on the total weight of all crosslinkable polymer and/or oligomer comprised in the coating composition (C1a), of at least one silicone (meth)acrylate oligomer.

With preference this composite (S1C1) is obtainable by implementation of the method steps (6) to (9), which are described in more detail below.

It has surprisingly been found that the at least partially embossed composite (S1C1) of the invention not only can be employed as a reusable embossing mold (e2), preferably as a reusable continuous embossing mold (e2), in an embossing method such as the method of the invention, but also that by virtue of the components present in the radiation-curable coating composition (C1a) used for producing this composite (S1C1), it is possible to achieve very effective separation between the composite (S1C1), which may be used as embossing mold (e2) within the embossing tool (E2), and the embossed coating (C2) and/or a corresponding composite such as the composite (S2C2) comprising such an embossed coating like the coating (C2), especially when performing the method of the invention and within the optional step (5-i) or (5-ii) therein, with very high quality of separation independent from the time passed after producing the composite (S1C1) employable as embossing mold and applying the coating composition (C2a) or time passed since embossing and curing of this product coating (C2). It has further been found in particular that especially when traversing method steps (6) to (9) for producing the composite (S1C1), the embossed structure of the coating (C1) can be obtained with high success of replication and replication quality of the features of the embossing mold by full mold filling over the entire width of the mold in a homogeneous layer thickness.

A further subject of the present invention, moreover, is a use of the composite (S1C1) of the invention as embossing mold (e2) of an embossing tool (E2) for transferring an embossed structure, preferably a embossed structure having a microstructured and/or nanostructured surface, to at least a part of a surface of a coating composition (C2a) optionally applied to a substrate (S2).

DETAILED DESCRIPTION

If reference is made in the context of the present invention to an official standard, this denotes the version of the standard that was current on the filing date, or, if no current version exists at that date, the last current version.

The term "at least" in the context of the invention, for example in connection with the coating composition (C1a) comprising at least one crosslinkable polymer and/or oligomer, is to be understood as including the specific number (one) and more, for instance the coating composition (C1a) is to comprise one, two, three, or four different or identical crosslinkable polymer and/or oligomers. The mathematical symbol with regard to the interpretation of the term "at least" is resembled by Similar applies to the interpretation of the term "at least" in combination with given numerical ranges, such as "at least 25 weight %", to be interpreted in the context of the invention as meaning 25 weight % to 100 weight %. The term "less than", such as less than 75 weight %, is construed to not include the number ("75") mentioned but to be interpreted as a range from 0 weight % up to 75 weight %. The mathematical symbol with regard to the interpretation of the term "less than" is resembled by "<".

In this description of the invention, for convenience, "polymer" and "resin" are used interchangeably to encompass resins, oligomers, and polymers.

The term "poly(meth)acrylate" stands both for polyacrylates and for polymethacrylates. Poly(meth)acrylates may therefore be constructed of acrylates and/or methacrylates and may contain further ethylenically unsaturated monomers such as, for example, styrene or acrylic acid. The term "(meth)acryloyl" in the sense of the present invention embraces methacryloyl compounds, acryloyl compounds and mixtures thereof.

In the context of this invention, $C_1$-$C_4$-alkyl means methyl, ethyl, isopropyl, n-propyl, n-butyl, isobutyl, sec-butyl and tert-butyl, preferably methyl, ethyl and n-butyl, more preferably methyl and ethyl and most preferably methyl.

The term "comprising" in the sense of the present invention, in connection with the coating compositions used in accordance with the invention, such as, for example, with the coating composition (C1a), and with the method of the invention and its method steps, preferably has the definition of "consisting of". With regard for example to the coating composition (C1a) employed in accordance with the invention—in addition to the components (a) and (b) and also (c) and optionally (d)—it is possible, moreover, for one or more of the other components identified below and optionally present in the coating composition (C1a) employed in accordance with the invention to be included in that composition. All the components may each be present in their preferred embodiments identified below. With regard to the method of the invention, it may have further optional method steps in addition to steps (1), (2-i) and (3-i) or (2-ii) and (3-ii), and also at least step (4) and, optionally, step (5-i) or (5-ii), such as, for example, the steps (6) to (9).

Inventive Method for Transferring an Embossed Structure, Comprising at Least Steps (1), (2-i) and (3-i) or (2-ii) and (3-ii), and Also at Least Step (4) and Optionally Step (5-i) or A first subject of the present invention is the method of the invention for transferring an embossed structure to at least a part of a surface of a coating composition (C2a) using a composite (S1C1), said method comprising at least the steps (1), (2-i) and (3-i) or (2-ii) and (3-ii), and also at least step (4) and optionally step (5-i) or (5-ii), as described below.

The method of the invention is preferably a continuous method.

The embossed structure is transferred or maintained by at least partial embossing of the coating composition (C2a) applied at least partially to the surface of the substrate (S2), as per method step (2-i) and (3-i). An alternative possibility is that of transfer by means of the method steps (2-ii) and (3-ii). The term "embossing" refers to the at least partial furnishing of the coating composition (C2a), optionally as part of a composite (S2C2a), on at least a part of its surface with an embossed structure. In this case at least a certain area of the coating composition (C2a) is furnished with an embossed structure. Preferably the entire surface of the coating composition (C2a), optionally as part of the composite (S2C2a), is furnished with an embossed structure. Similar comments apply in connection with the term "embossing" with regard to the at least partially embossed composite (S1C1) preferably employable as embossing mold (e2) of an embossing tool (E2), and composed of a substrate (S1) and of an at least partially embossed and at least partially cured coating (C1), which may be produced in accordance with steps (6) to (9) described below.

Step (1):

In step (1) of the inventive method, a composite (S1C1) composed of a substrate (S1) and an at least partially cured and at least partially embossed coating (C1) is provided.

The embossed structures of the composite (S1C1), embossing mold (e1) and also of composite (S2C2a) and composite (S2C2) described in following steps, are based preferably and in each case independently of one another on a repeating and/or regularly arranged pattern or are completely randomized. The structure in each case may be a continuous embossed structure such as a continuous groove structure or else a plurality of preferably repeating individual embossed structures. The respective individual embossed structures in this case may in turn be based preferably on a groove structure having more or less strongly pronounced ridges (embossed elevations) defining the embossed height of the embossed structure. In accordance with the respective geometry of the ridges of a preferably repeating individual embossed structure, a plan view may show a multiplicity of preferably repeating individual embossed structures, each of them different, such as, for example, preferably serpentine, sawtooth, hexagonal, diamond-shape, rhomboidal, parallelogrammical, honeycomb, circular, punctiform, star-shaped, rope-shaped, reticular, polygonal, preferably triangular, tetragonal, more preferably rectangular and square, pentagonal, hexagonal, heptagonal and octagonal, wire-shaped, ellipsoidal, oval and lattice-shape patterns, it also being possible for at least two patterns to be superimposed on one another. The ridges of the individual embossed structures may also have a curvature, i.e., a convex and/or concave structure.

Preferably, the embossed coating (C1) comprises at least one microstructured and/or nanostructured surface comprising microscale and/or nanoscale surface elements. The respective embossed microscale and/or nanoscale surface elements may be described by their width such as the width of the ridges, in other words by their structure width, and by the height of the embossments, in other words by their structure height (or structure depth). The structure width such as the width of the ridges may have a length of up to one centimeter, but is preferably situated in a range from 10 nm to 1 mm. The structure height is situated preferably in a range from 0.1 nm to 1 mm. Preferably, however, the respective embossed structure represents a microstructure and/or nanostructure.

The size of a specific microscale or nanoscale surface element, respectively, is defined as its maximum extension in any direction parallel to the surface, i.e., for example, as the diameter of a cylindrical surface element or the diagonal of the base surface of a pyramidal surface element. In case of surface elements having a macroscale extension in one or more directions within the surface (or parallel to the surface) and a microscale or nanoscale extension in one or more other directions within the surface, the term size of the surface elements refers to the microscale and/or nanoscale extension of such surface elements. The length of a specific microscale or nanoscale surface element, respectively, is defined as its extension in the direction of the length of the structured surface. Likewise, the width of a specific microscale or nanoscale surface element, respectively, is defined as its extension in the direction of the width of the structured surface.

The height of a protruding (or elevating) surface element is defined by its respective extension as measured from the adjacent bottom surface on which the respective protruding surface element is arranged in the direction perpendicular to such bottom surface. Likewise, the depth of a surface element extending downwardly from an adjacent top exposed surface is defined by its respective downward extension as measured from the adjacent top surface from which the indentation extends, in the direction perpendicular to such top surface.

The distance between two adjacent surface elements is defined as the distance between two maxima or two relative maxima, respectively, between such surface elements in a direction within the structured surface. Structured surfaces having a regular sequence of surface elements in one or more given direction parallel to the surface can be characterized by one or more pitch lengths in such directions. In a certain direction parallel to the surface the term pitch length denotes the distance between corresponding points of two adjacent, regularly repetitive surface elements. This may be illustrated for a structured surfaces comprising an alternating sequence of channel- and rail-type surface elements surface elements which both macroscopically extend, essentially parallel to each other, in a first longitudinal direction and which each have a microscale and, optionally, nanoscale cross-section normal to said longitudinal direction). The pitch length of such structured surface normal to the longitudinal direction is the sum of the width of the channel-type surface element and the width of the rail-type surface element in such normal direction.

Preferably, the respective microstructured and/or nanostructured surface to be transferred by embossing comprises microscale and/or nanoscale surface elements with a structure width favorably situated in a range from 10 nm to 1000 μm, preferably 10 nm to 500 μm, more preferably in a range from 25 nm to 400 μm, very preferably in a range from 50 nm to 250 μm, more particularly in a range from 100 nm to 100 μm, and a structure height situated favorably in a range from 10 nm to 1000 μm, preferably in a range from 10 nm to 500 μm, more preferably in a range from 25 nm to 400 μm, very preferably in a range from 50 nm to 300 μm, more particularly in a range from 100 nm to 200 μm. These dimensions apply for the embossed structures both of the composite (S1C1) and of the composite (C2S2) and coating (C2), as well as, logically, for the embossing mold (e1) in optional step (7).

The structure width and structure height of the respective surface comprising microstructured and/or nanostructured surface elements are preferably determined by production of a cross section of the surface and determination of the structure height and structure width of said cross section by means of optical and/or scanning electron microscopy.

The composite (S1C1) provided in step (1) of the inventive method can be prepared by various processes, for example lithographic methods, such as nanoimprint lithography, laser lithography and photo lithography. Preferred is the preparation of composite (S1C1) by steps (6) to (9) as specified in more detail later.

The composite (S1C1) preferably used as embossing mold (e2) in step (3-i) and step (2-ii) and made up of substrate (S1) and at least partially embossed and at least partially cured coating (C1), is also referred to in this invention as "master substrate" or "master film". Where the substrate (S1) is a film, the corresponding master film is referred to as "master foil". Where the substrate (S1) is a foil web, the corresponding master film is referred to as "master foil web". The coating (C1) of the master film is also referred to hereinafter as "at least partially cured master coating" or "master coating film", and the coating composition (C1a) used for producing the cured master coating is referred to as "master coating". Between (S1) and (C1) in the composite (S1C1) there is preferably no further (coating) layer. It is possible, however, for there to be at least one adhesion promoter layer present between (S1) and (C1) of the composite (S1C1), this layer in this case being preferably permeable to UV radiation.

Step (2-i) and (3-i)

Following step (1), in a first alternative, a coating composition (C2a) is applied at least partially to a substrate (S2) to provide a composite (S2C2a), followed by at least partially embossing of the coating composition (C2a) of the composite (S2C2a) using the composite (S1C1) to provide composite (S1C1C2S2). This first alternative of the inventive method is described here by steps (2-i) and (3-i).

Step (2-i)

Step (2-i) of the method of the invention provides for application of a radiation-curable coating composition (C2a) to at least a part of a surface of a substrate (S2) to provide a composite (S2C2a).

The substrate (S2) represents a carrier material for the coating composition (C2a) or the coating (C2) to be applied thereto. The substrate (S2) or, if a coated substrate is used, the layer located on the surface of the substrate (S2) and being in contact with the coating composition (C2a), consists preferably of at least one thermoplastic polymer, selected more particularly from the group consisting of polymethyl (meth)acrylates, polybutyl (meth)acrylates, polyethylene terephthalates (PET), polybutylene terephthalates (PBT), polyvinylidene fluorides, polyvinyl chlorides, polyesters, including polycarbonates and polyvinyl acetate, preferably polyesters such as PBT and PET, polyamides, polyolefins such as polyethylene, polypropylene, polystyrene, and also polybutadiene, polyacrylonitrile, polyacetal, polyacrylonitrile-ethylene-propylene-diene-styrene copolymers (A-EPDM), polyimide (PI), polyetherimides (PEI), cellulose triacetate (TAC), phenolic resins, urea resins, melamine resins, alkyd resins, epoxy resins, polyurethanes, including thermoplastic polyurethane (TPU), polyether ketones, polyphenylene sulfides, polyethers, polyvinyl alcohols, and mixtures thereof. Particularly preferred substrates or layers on the surface thereof are polyolefins such as, for example, PP (polypropylene), which may alternatively be isotactic, syndiotactic or atactic and may alternatively be unoriented or oriented through mono- or biaxial drawing, SAN (styrene-acrylonitrile copolymers), PC (polycarbonates), PMMA (polymethyl methacrylates), PBT (poly(butylene terephthalate)s), PA (polyamides), ASA (acrylonitrile-styrene-acrylic ester copolymers) and ABS (acrylonitrile-butadiene-styrene copolymers), and also their physical mixtures (blends). Particularly preferred are PP, SAN, ABS, ASA and also blends of ABS or ASA with PA or PBT or PC. Especially preferred are PET, PBT, PP, PE, and polymethyl methacrylate (PMMA) or impact-modified PMMA. Especially preferred is a polyester, most preferably PET, for use as material for the substrate (S2). Alternatively, the substrate (S2) itself—optionally in spite of a layer of at least one of the aforementioned polymers applied thereto—may be made of a different material such as glass, ceramic, metal, paper and/or fabric. In that case the substrate (S2) is preferably a plate and may be used, for example, in a roll-to-plate (R2P) embossing apparatus.

The coating composition (C2a) is favorably radiated through substrate (S2) or composite (S1C1), preferably through substrate (S2). Therefore, the permeability of the substrate (S2) for radiation is preferably harmonized with the absorption maximum, or at least in the absorption range, of the at least one photoinitiator used in coating composition (C2a). Further layers, for example adhesion promoting layers preferably being permeable to UV radiation can be present between (S2) and (C2a) in the composite (S2C2a). It is favorable, however, if no further layer is present between (S2) and (C2a) in the composite (S2C2a). Alternatively, if radiation is provided to coating composition (C2a) through composite (S1C1), substrate (S2) may also be non-transparent to the radiation, such as the UV radiation, applied. Additionally, substrate (S2) might also be selected from polymeric substrates covered on one side with (i) a one or double-sided adhesive tape optionally comprising a release liner or (ii) with a self-adhesive layer or from self-adhesive polymeric substrates.

The thickness of the substrate (S2) is preferably 2 μm up to 5 mm. Particularly preferred is a layer thickness of 25 to 1000 μm, more particularly 50 to 300 μm.

The substrate (S2) is preferably a film, more preferably a film web, very preferably a continuous film web. In that case the substrate (S2) may be used preferably in a roll-to-roll (R2R) embossing apparatus or in a plate-to-roll (P2R) embossing apparatus.

In the sense of the present invention, the term "continuous film" or "continuous film web" refers preferably to a film having a length of 100 m to 10 km.

When step (2-i) is being carried out (and preferably also when steps (3-i), (4) and (5-i) of the method are being carried out, and also when steps (2-ii), (3-ii), (4) and (5-i) or (5-ii) of the inventive method are being carried out), the substrate (S2) is preferably moving and is therefore a moving substrate. During the implementation of step (2-i) and (3-ii), the substrate (S2) is preferably moved by means of a transport device such as a conveyor belt. The corresponding device used for implementing step (2-i) and also step (3-ii) therefore preferably comprises such a transport device. The corresponding device used for implementing step (2-i) further comprises a means for applying the preferably radiation-curable coating composition (C2a) to at least a part of a surface of the substrate (S2). Similar comments apply in respect of the corresponding apparatus used for implementing step (3-ii) and optional steps (6) to (9).

The coating composition (C2a) provided in step (2-i) and (2-ii) of the inventive method can be any kind of coating composition, as described further below. Favorably, the coating composition (C2a) applied in steps (2-i) and (2-ii) is applied in a dry film thickness of at least 0.5 μm, preferably at least 1 μm to 1,000 μm, and more preferably at least 5 μm up to 1,000 μm.

Favorably, the coating composition (C2a) applied in steps (2-i) and (2-ii) is applied in a dry film thickness of at least 0.5 μm, preferably 5 to 1,000 μm, more preferably 6 to 900 μm, even more preferably from 7 to 700 μm, particularly from 8 to 500 μm, particularly preferably from 9 to 400 μm, especially from 10 to 300 μm, as determined according to DIN EN ISO 2808:2007-05, procedure 12A. The dry film thickness in the sense of the present invention preferably denotes the film thickness of the dry film above the protrusions of the embossed structure preferably comprising the micro-scale and/or nano-scale surface elements of the surface of coating (C2) or, in analogy, coating (C1).

Step (3-i)

Step (3-i) of the method of the invention provides for at least partial embossing of the coating composition (C2a), applied at least partially to the surface of the substrate (S2), by means of the composite (S1C1), wherein the composite (S1C1) is preferably used as embossing mold (e2) of an embossing tool (E2), the composite (S1C1) being composed of a substrate (S1) and of an at least partially embossed and at least partially cured coating (C1), providing as product of the at least partial embossing a composite (S1C1C2aS2). The composite (S1C1), preferably used as embossing mold (e2), may be pre-wetted with a coating composition (C2a), before the composite (S1C1) is brought in contact with the to be embossed coating composition (C2a).

The at least partial embossing transfers an embossed structure at least partially to the surface of the coating composition (C2a) applied to the substrate (S2). The term "embossing" refers to a process where at least a part of the surface of the coating composition (C2a) after step (3-i) and (4), as part of the composite (S2C2), exhibits an embossed structure. In this case at least a certain area of the coating composition (C2a) of composite (S2C2) is furnished with an embossed structure. Preferably, the entire surface of the coating composition (C2a) of composite (S2C2) is furnished with an embossed structure. Similar comments apply in connection with the term "embossing" with regard to steps (2-ii) and (4) of the inventive method and optional steps (7) and (8) of providing the composite (S1C1). The features or structure embossed into the coating composition (C2a) (or, with regard to providing a composite (S1C1), the coating composition (C1a)), is thereby the mirror image of the structured surface of the embossing mold. In the inventive method, the embossed structure of the composite (S1C1) is transferred to the coating composition (C2a) or, after at least partial curing, coating (C2), wherein composite (S1C1) is preferably used as embossing mold (e2) of an embossing tool (E2). Therefore, the structure embossed into the coating composition (C2a) is the mirror image of embossed structure of at least one surface of the composite (S1C1) comprising a substrate (S1) and an at least partially cured and at least partially embossed coating composition (C1). The image of the embossed surface of the at least partially embossed coating composition (C2a) and of the at least partially cured and partially embossed coating composition (C2) may therefore correspond to the image of the embossing mold (e1), wherein the embossing mold (e1) was used to emboss the coating composition (C1a) of the composite (S1C1), as described further below.

Step (3-i) preferably transfers microstructures and/or nanostructures as embossed structure onto the coating composition (C2a).

The corresponding apparatus preferably used for implementing step (3-i) (and in analogy for steps (2-ii) and (3-ii) of the method) comprises a means for at least partially embossing the coating composition (C2a), applied at least partially to the surface of the substrate (S2), by means of at least one embossing tool (E2) comprising at least one embossing mold (e2). The apparatus used preferably further comprises a means for pressing the embossing mold (e2) of the embossing tool (E2), thus the composite (S1C1), onto the substrate (S2), used preferably in the form of a continuous film web, after the application of the radiation-curable coating composition (C2a) to (S2), this means being situated preferably downstream of the means for applying the radiation-curable coating composition (C2a), as viewed in the direction of conveying of the substrate (S2).

If necessary, step (3-i) may be carried out at elevated temperatures, as for example at 30° C. to 100° C. or up to 80° C. In that case, the composite (S2C2a) runs first through a heating roll mechanism, followed optionally by irradiation with infrared light, before the actual embossing procedure, i.e. the curing while in contact with the embossing tool (E1), takes place. After the embossing and curing, the embossed composite (S2C2) runs optionally through a cooling roll mechanism for cooling. Alternatively, curing may also take place with cooling: in this case, the composite (S2C2a) for embossing runs first through a cooling roll mechanism, before the actual embossing procedure described before takes place. Instead of using a separate heating or curing roll mechanism, it is also possible to heat or cool the embossing tool (E2).

Thus, the corresponding apparatus preferably employed for embossing coating composition (C2a) applied to a substrate (S2) preferably comprises the following means:
(a) a transport means for transporting substrate (S2), preferably a conveyor belt,
(b) means for applying the preferably radiation-curable coating composition (C2a) to at least a part of a surface of the moving substrate (S2),
(c) an embossing tool (E2) comprising at least one embossing mold (e2) being situated preferably downstream of the means for applying the radiation-curable coating composition (C2a), as viewed in the direction of conveying of the substrate (S2), wherein the embossing tool (E2) optionally comprises means for pressing the embossing mold (e2) of the embossing tool (E2) on the substrate (S2),
(d) optionally means for heating, preferably a heating roll mechanism optionally combined with means for IR radiation,
(e) optionally means for cooling, preferably a cooling roll mechanism, and
(f) means for radiation, preferably UV radiation.

The embossing tool (E2) may preferably be an embossing calender, which preferably comprises a grid application mechanism, more preferably a grid roll mechanism. This calender possesses counter-rotating rolls, preferably arranged above one another in the height direction with a certain spacing, and the composite (S2C2a) to be provided with an embossed structure is supplied to the rolls and is guided through the roll nip which forms, with the nip width being variably adjustable. The grid roll mechanism here preferably comprises a first roll such as a metallic roll, as for example a steel roll, a steel roll covered with a metal layer such as a copper or a nickel layer optionally containing small amounts of phosphorous, or a roll covered with a nickel sleeve which optionally contains small amounts of phosphorus, or else a quartz-based roll. Alternatively, however, soft materials such as rubber or polydimethylsiloxanes (PDMS), for example, may also be used as first roll or rolls covered with at least one soft material such as rubber or PDMS. Moreover, rolls may be employed that are coated with at least one plastic. Furthermore, the grid roll mechanism comprises a second roll, wherein the second roll preferably is a pressing roll made of steel, or a roll coated with at least one plastic or a soft material such as rubber or PDMS. The second roll serves as an impression or pressing roll. The composite (S2C2a) to be embossed, in the form for example of a film web coated at least partially with coating composition (C2a), is moved by means of the second roll or pressing roll counter-directionally to the first roll. At the point of the roll nip formed by the counter-rotating rolls disposed with a certain distance from one another, embossing takes place in accordance with step (3-i). The first roll, which carries the composite (S1C1) as embossing mold (e2), serves here for embossing the composite (S2C2a) which is guided by the second roll, opposite this embossing roll, with the second roll pressing the composite (S2C2a), to be provided with an embossed structure, against the first embossing roll. By this step, the mirror image of the embossed structure of the surface of the coating (C1) of composite (S1C1) is transferred to the surface of the coating composition (C2a) of composite (S2C2a) in step (3-i) or (2-ii) of the method.

The embossing tool (E2) including the embossing mold (e2) is preferably pressed at least partially onto the applied coating composition (C2a) during the implementation of step (3-i).

The composite (S1C1) can be employed as a reusable continuous embossing mold (e2) of the embossing tool (E2) and allows very effective separation between the composite (S1C1) and the at least partially cured and at least partially embossed coating (C2) optionally applied to a substrate (S2) comprising a structured surface, preferably within the method of the invention when the latter necessarily comprises step (5-i) or (5-ii). Step (3-i) preferably transfers microstructures and/or nanostructures in the dimensions previously described in connection with the composite (S1C1) provided in step (1).

The embossing mold (e2), in other words favorably the composite (S1C1), preferably comprises as substrate (S1) a film web which comprises an at least partially embossed and at least partially cured coating (C1). With particular preference the substrate (S1) is a continuous film web which comprises the at least partially embossed and at least partially cured coating (C1), thus making the composite (S1C1) used as embossing mold (e2) a continuous embossing mold, this being so especially when the substrate (S2) as well is a continuous film web.

Steps (2-ii) and (3-ii)

Following step (1), and in alternative to steps (2-i) and (3-i), the coating composition (C2a) can also first be at least partially applied to the composite (S1C1) and at least partially embossed thereby, before optionally a substrate (S2) is at least partially applied to the surface, formed by coating composition (C2a). This second alternative of the inventive method, compared to the first alternative of the inventive method comprising steps (2-i) and (3-i), is described here by steps (2-ii) and (3-ii).

Step (2-ii)

Step (2-ii) of the method of the invention provides for applying at least one coating composition (C2a) to at least part of an at least partially embossed and at least partially cured surface of composite (S1C1) and at least partially embossing the coating composition (C2a) using composite (S1C1) to provide composite (S1C1C2a);

The composite (S1C1) preferably used as embossing mold (e2) of an embossing tool (E2) can optionally be prewetted before application of the coating composition (C2a).

The coating composition (C2a) provided in step (2-i) and (2-ii) of the inventive method can be any kind of coating composition, preferably a radiation-curable coating composition, as described further below. Favorably, the coating composition (C2a) applied in steps (2-i) and (2-ii) is applied in a dry layer thickness of at least 0.5 μm, preferably at least 1 μm, and more preferably at least 5 μm up to 1.000 μm.

By step (2-ii), the desired (mirror-image) of the at least partially embossed and at least partially cured coating (C1) on substrate (S1) of composite (S1C1) is to be transferred from the composite (S1C1) to the coating composition (C2a) and, after implementation of step (4), to the coating (C2), by the application of the preferable radiation-curable coating composition (C2a) to at least a part of an at least partially embossed surface of a composite (S1C1). The composite (S1C1) therefore functions not only as carrier material for (C2a) or (C2), but also, furthermore, as an embossing mold, preferably as embossing mold (e2) of an embossing tool (E2).

The at least partial embossing in step (2-ii) preferably takes place by pressing the applied coating composition (C2a) onto the composite (S1C1) favorably used as embossing mold (e2) of an embossing tool (E2). Said application of pressure can, for example, be achieved by means such as a roll or a grid roll mechanism comprising at least one roll after the application of the coating composition (C2a). Pressures typically applied are in a range from 1 to 10 bar, preferably 2 to 8 bar, more preferably 3 to 7 bar. The grid roll mechanism here preferably comprises a metallic roll, as for example a steel roll, a steel roll covered with a metal layer, such as a copper layer, a nickel layer optionally containing small amounts of phosphorous, or a roll covered with a nickel sleeve which optionally contains small amounts of phosphorus, or else a quartz-based roll or a roll coated with at least one plastic, a rubber or a silicone, such as PDMS. Optionally, the applied coating composition (C2a) can be lined temporarily with a foil to protect the coating composition (C2a) favorably against oxygen and mechanical influences at least during embossing and curing in steps (2-ii) to step (4), but also during step (5). Following removal of the temporarily applied foil, favorably having a thickness of 5 µm to 250 µm, a composite (S1C1C2) is provided. Suitable materials for the temporarily applied foil are selected from the same materials which can also be used for producing the substrate (S2) as described above. Reference is hereby made explicitly to the corresponding passages. Alternatively, said foils can be selected from materials typically observed for release liners or cellulose triacetate (TAC). Favorably, the temporarily applied foil is composed of PET or TAC.

Step (3-ii)

Step (3-ii) of the method of the invention provides for optional application of the substrate (S2) to at least a part of the surface, formed by coating composition (C2a), of the composite (S1C1C2a), to give a composite (S1C1C2aS2).

Preferably, the composite (S1C1) favorably used as embossing mold (e2) in step (2-ii), following the application of the coating composition (C2a) to at least a part of its at least partially embossed surface, to give the composite (S1C1C2a), is guided, during the implementation of step (3-ii), over a first roll as part of the embossing tool (E2), and the substrate (S2) used within step (3-ii) is guided via a second roll, which is opposite to the first roll and is counter-rotatory thereto or is co-rotatory therewith, preferably counter-rotatory.

The at least partial embossing as per step (3-ii) takes place preferably at the level of the roll nip formed by the two mutually opposed rolls, rotating counter-directionally or co-directionally (in the same direction), with the coating composition (C2a) of the composite (S1C1C2a) facing the substrate (S2). The at least partial embossing in this case is achieved preferably by pressuring or pressing of the substrate (S2) onto the composite (S1C1C2a), for example by the second roll or pressing roll.

The corresponding apparatus described earlier preferentially used for implementing steps (2-i) and (3-i) of the method may equally be employed, in a fundamentally analogous way, to implement steps (2-ii) and (3-ii) of the method.

Step (4)

Following steps (2-i) and (3-i) in the first alternative of the inventive method, or following steps (2-ii) and (3-ii) in the second alternative of the inventive method, step (4) of the method of the invention provides for at least partially curing the at least partially embossed coating composition (C2a) optionally applied to a substrate (S2) obtained after step (3-i) or (3-ii) which throughout the duration of the at least partial curing is in contact with the composite (S1C1) preferably used as embossing mold (e2) to provide a composite (S1C1C2) or (S1C1C2S2).

In step (4), the applied coating composition (C2a) is at least partially cured to give an at least partially embossed and partially cured coating material optionally comprising the substrate (S2). The term "at least partially curing" with respect to the coating composition (C2a) is understood to mean the conversion of said coating composition (C2a) to a state, wherein at least a part of the coating composition is transformed to a film allowing further processing or handling of the formed coating (C2), such as for example a post-exposure step to increase the double bond conversion ratio or removing the coating (C2) either as part of the composite (S2C2) or as freestanding film (C2).

Preferably throughout the duration of the at least partial curing in step (4), the means used in steps (2-i) and (3-i) or steps (2-ii) and (3-ii) for applying pressure or pressing the applied coating composition (C2a) onto the at least one composite (S1C1) favorably used as embossing mold (e2) is in contact with the coating composition (C2a) and/or with the at least partially cured coating (C2) formed therefrom.

Step (3-i) or step (2-ii) and (3-ii), and step (4) are preferably carried out concurrently. In that case the at least partial curing as per step (4) takes place preferably in situ during the implementation of step (3-i).

The corresponding apparatus preferably used in implementing step (4) therefore preferably comprises at least one radiation source for irradiating the coating composition (C2a) with a curative radiation. Since the coating composition (C2a) is preferably a UV-curable coating composition, the curative radiation used is preferably UV radiation. If the coating composition (C2a) is not radiation-curable, it is preferably chemically curable. In that case the curing of step (4) takes place thermally, by use of suitable thermal radiation sources, for example. Also possible, of course, is combined curing, i.e., thermal curing and curing by means of UV radiation.

Examples of suitable radiation sources of the radiative curing include low-pressure, medium-pressure and high-pressure mercury emitters and also fluorescent tubes, pulsed emitters, metal halide emitters (halogen lamps), lasers, LEDs and, moreover, electronic flash installations, enabling radiative curing without a photoinitiator, or excimer emitters. Radiative curing takes place through exposure to high-energy radiation, i.e., UV radiation or daylight, or by bombardment with high-energy electrons. The radiation dose typically sufficient for crosslinking in the case of UV curing is in the range from 80 to 3000 mJ/cm$^2$. It is of course also possible to use two or more radiation sources for the curing—two to four, for example. These sources may also each emit in different wavelength ranges.

The at least partial curing in step (4) takes place through the substrate (S2) and/or the composite (S1C1) favorably by irradiation. Preferably irradiation takes place through composite (S1C1). If no substrate is present in step (3-ii) and the composite (S1C1) is favorably used as the at least one embossing mold (e2) of the embossing tool (E2), irradiation is preferably performed through the composite (S1C1) used as substrate. In both cases it is advantageous for the permeability of the substrate (S2), optionally comprising on one side (i) a one or double-sided adhesive tape optionally comprising a release liner or (ii) with a self-adhesive layer or from self-adhesive polymeric substrates, and/or further layers between substrate (S2) and coating composition (C2a), or the substrate (S1) in composite (S1C1), to be harmonized with the absorption maximum or at least the absorption range, of the at least one photoinitiator used, present preferably in the coating composition (C2a). Thus, for example, the material PET as substrate (S2), hence a PET film, for example, is permeable to radiation having a wavelength of below 400 nm. Photoinitiators which generate radicals with such radiation include, for example, diphenyl (2,4,6-trimethylbenzoyl)phosphine oxide, ethyl (2,4,6-trimethylbenzoyl)phenylphosphinate and phenylbis(2,4,6-trimethylbenzoyl)phosphine oxide. In this case, therefore, there is preferably at least one such photoinitiator present in the coating composition (C2a).

Optional Step (5-i) or (5-ii)

Following step (4), optional steps (5-i) or (5-ii) is performed, depending on the presence of the substrate (S2). Hence, in the first alternative of the inventive method, defined by steps (2-i) and (3-i), a substrate (S2) is mandatory present. Therefore, only optional step (5-i) can be applicable. In the second alternative of the inventive method, defined by steps (2-ii) and (3-ii), optional step (5-i) is applicable if the optional substrate (S2) in step (3-ii) has been applied to at least a part of the surface formed by coating composition (C2a), if, however, optional substrate (S2) was not applied in step (3-ii), only step (5-ii) can be applicable here.

Step (5-i) and (5-ii) in the method of the invention provide for optional removal of the embossed coating (C2) optionally applied to a substrate (S2) from the composite (S1C1) preferably used as embossing mold (e2), providing a composite (S2C2) composed of a substrate (S2) and of an at least partially embossed and at least partially cured coating (C2) or, in absence of optional substrate (S2), a freestanding coating (C2), with restoration of the composite (S1C1) provided in step (1) of the method. With preference, step (5-i) or (5-ii) is implemented.

Said removal from the composite (S1C1), preferably used as embossing mold (e2), can be performed, for example, by peeling the at least partially embossed and at least partially cured coating (C2) optionally applied to a substrate (S2) from the composite (S1C1) or vice versa. Peeling can either be performed manually or by using commonly known mechanical dividing means.

Alternatively, the removal from the composite (S1C1) can comprise the following steps:
  5-i-a) applying at least one adhesive layer (AL) on the surface of the substrate (S2) not being in contact with the at least partially embossed coating (C2) providing a composite (S1C1C2S2AL);
  5-i-b) optionally, at least partially attaching the composite (S1C1C2S2AL) to an object (O1);
  5-i-c) removing, preferably peeling, composite (S1C1) from the composite (C2S2AL) optionally at least partially attached to an object (O1), or vice versa;
or
  5-ii-a) applying at least one adhesive layer (AL) on at least a part of the unstructured surface of the at least partially embossed coating (C2) providing a composite (S1C1C2AL);
  5-ii-b) optionally, at least partially attaching the composite (S1C1C2AL) to an object (O1);
  5-ii-c) removing, preferably peeling, composite (S1C1) from the composite (C2S2AL) optionally at least partially attached to an object (O1), or vice versa.

The adhesive layer (AL) can, for example, be a laminating adhesive, such as a polyacrylate or a polyacrylate-based adhesive. However, the adhesive layer (AL) is preferably a self-adhesive layer or a multi-layer construction. Such a self-adhesive layer may be applied by common methods such as laminating or spraying the adhesive. Said multi-layer constructions comprises, for example, a middle polymer layer (PL) also called in-liner, which is coated with an adhesive (AH) on both surfaces. Said adhesive (AH) may each be a polyacrylate or a polyacrylate-based adhesive. In principle, any type of polymer can be used to prepare the middle polymer layer (PL). Examples of such polymers are those polymers already described as substrate (S2).

Reference is explicitly made to that paragraphs. Preferred middle polymer layers (PL) are poly(meth)acrylates, polyesters such as PET and/or PBT, polyvinylidene fluorides, polyvinylchlorides, polyamides and/or polyolefins. In particular, a polyester such as PET can be used. The layer thickness of the polymer layer (PL) may be in a range from 5 to 55 µm, preferably from 6 to 50 µm, more preferably from 7 to 40 µm, in particular from 8 to 30 µm. Each adhesive (AH) may initially be covered by a release liner, such as silicone paper, for better handling. However, prior to use as an adhesive layer (AL) in the step 5-i) or step (5-ii) one of the two release liners is removed. The other release liner is preferably removed in a later step of the inventive process, more preferably before at least partially attaching the composite (S1C1C2) or (S1C1C2S2) to at least one object (O1). Hence, before separating composite (S1C1) from the coating (C2) or composite (C2S2) comprising an adhesive layer (AL), these composites are attached to an object (O1) and only thereafter the composite (S1C1) is removed, preferably by peeling, from the coating (C2) or composite (C2S2) at least partially attached via the adhesive layer (AL) to an object (O1). Suitable objects (O1) can be made of various materials, including metal, plastic, reinforced materials, glass, rubber, fabric, leather, paper, wood and mixtures thereof. Preferably, the at least one object (O1) is selected from the group consisting of surfaces being in contact with liquids and gases, such as airplanes, ships and cars, rotor blades, drilling platforms, pipelines, lighting systems, displays, photovoltaic modules, structural elements and decorative elements.

Steps 5-i-a) and (5-i-b), or 5-ii-a) and 5-ii-b), can either be performed manually or by a machine comprising at least one transportation means for the adhesive layer (AL), at least one pressurizing means for applying pressure to fix the adhesive layer (AL) on at least a part of the unstructured surface of the at least partially embossed coating (C2) or on the surface of the substrate (S2) not being in contact with the at least partially embossed coating (C2) and at least one dividing means for removing, preferably peeling, the coating (C2) or composite (S2C2), respectively, from the composite (S1C1) favorably employed as embossing mold (e2) of the embossing tool (E2), or vice-versa.

Removal of the at least partially embossed and at least partially cured coating (C2) or composite (S2C2), respectively, from the composite (S1C1), is preferably performed easily, without destruction of the structured and embossed surface and without leaving significant residues, preferably without leaving any residues, on the surface of the coating (C1) of the composite (S1C1).

FIG. 1 shows schematically a side view of an apparatus which can be used to implement steps (1), (2-i) and (3-i) and also (4) and optionally (5-i) of the method of the invention and which is used for exemplary illustration of the method of the invention. This apparatus may equally be employed, in a fundamentally analogous way, to implement steps (1), (2-ii) and (3-ii) and also (4) and optionally (5-i) or (5-ii) of the method of the invention as well. By means of this apparatus it is possible to transfer structures such as microstructures and/or nanostructures preferably from an embossing mold (S1C1, e2) present as master film onto a substrate (S2) coated with (C2a). This apparatus is therefore also referred to generally as a transfer apparatus and is given the reference symbol (10) in FIG. 1.

The core of the transfer apparatus (10) is an embossing region (1) in which there is arranged a press roll (2) having a roll jacket made of fused silica. The press roll (2) is driven for rotation. Arranged alongside the press roll (2) is a radiation source in the form of lighting unit (3), which generates UV light and may in particular comprise a row of UV-LEDs disposed in the lengthwise direction of the press roll (2). As shown in FIG. 1, the lighting unit (3) may also be disposed in the interior of the press roll (2). Arranged in a manner pressed against the press roll (2) is a pressing roll (4), in the embossing region (1). In a mold frame (5) of the transfer apparatus (10) there are two film web rollers (6) and (7) arranged, which can be motor-driven for rotation. Of course, the film web rollers (6) and (7) can also be mounted and arranged otherwise than in a mold frame (5), e.g., in a cabinet element or else outside the actual transfer apparatus (10). Rolled onto the film web rollers (6) and (7), which here are shown as disposed in the mold frame, is a master film web (8) which represents a continuous embossing mold. On a transfer surface, the master film web (8) is provided with a master coating layer (C1), which features negative shapes, as a surface relief, of microstructures and/or nanostructures that are to be transferred. The master coating layer (C1) is at least partially cured, and so the relief-like structures within it are stable. The master film web (8) can be obtained by implementation of steps (6) to (9) of the method of the invention, and thus constitutes a composite (S1C1). The master film web (8) runs off from the first film web roller (6), is supplied via various deflection roller systems to the embossing region (1), and runs, as is evident in FIG. 1, perpendicularly from above into the region between the press roll (2) and the pressing roll (4). In that region it is guided in taut contact over a section of the periphery of the press roll (2), and then leaves the press roll (2) again and is supplied, once more via deflection roller systems with web tensioners, to the second film web roller (7), on which it is wound up. A film web (9) forming the substrate (S2), which is to be provided with structures such as microstructures and/or nanostructures, is supplied, starting from a film web roller (11), here again via various deflection roller systems with web tighteners, to the embossing region (1), where it runs tautly over a peripheral section of the pressing roll (4), from where it enters into the region of the contact of the pressing roll (4) on the press roll (2) or into the region of the roll nip formed between these elements. The film web (9) leaves this region, in the representation of FIG. 1, perpendicularly downward and is guided—again guided via deflection roller systems and web tighteners—to a film web roller (12), on which it is wound up as a fully treated product. On its path into the embossing region (1) or on to the roll nip between the press roll (2) and the pressing roll (4), the film web (9) is provided with a coating layer on its surface facing the press roll (2) in the press region (1), by means of a coating application unit (27), which in this case is disposed outside the press region (1). The coating application unit (27) therefore applies a coating composition (C2a) to the film web (9) used as (S2) in accordance with step (2-i) of the method of the invention. In the press region (1), the film web (9) is then brought together, by its surface provided with the as yet uncured coating layer, with the surface, provided with the master coating layer, of the master film web (8), in order to implement step (3-i) of the method of the invention. In this case the film web (9) runs via the pressing roller (4), and the master film web (8) runs via the press roll (2). Both webs, the film web (9) and the master film web (8), are facing one another with their surfaces provided with the respective coating layer (in the case of the master film web (8), the at least partially cured master coating layer, corresponding to the coating (C1); in the case of the film web (9), the uncured coating layer, corresponding to the coating composition (C2a)). In the region in which the pressing roll (4) is pressed against the press roll (2), the negative image of the structures to be transferred, such as microstructures and/or nanostructures, which is formed in the master coating layer (C1) is impressed into the uncured coating layer corresponding to the coating composition (C2a), and the structures are transferred as a result. At the same time, the lighting unit (2) performs UV illumination and therefore implements at least partial curing of the uncured coating layer, corresponding to the coating composition (C2a) of the coating layer on the film web (9), for as long as this coating layer is still in contact with the master coating layer (8). Accordingly, directly during transfer of the structures and in situ, the at least partial curing of the coating layer is carried out. The irradiation of the film web (9), or of the uncured coating layer applied thereon, is accomplished here through the film material (9) in the case of irradiation from outside onto the press cylinder (2). Alternatively, irradiation takes place through the fused silica material of the outer surface of the press cylinder (2) and also through the material of the master film web (8) and of the master coating layer applied thereon. Accordingly, master film web (8) and master coating layer are designed so as to be permeable to the radiation used, in this case UV light. The outer surface of the press roll (2) is described here as consisting of fused silica. Any other material, however, is also suitable here in principle, provided that it is permeable to the curative radiation (which may be other than UV light) emitted from the interior of the press roll (2). Alternatively, instead of the lighting unit (3) which supplies UV illumination, it is also possible, for example, to use a thermal emitter if the coating composition (C2a) is a non-radiation-curing coating composition. A possibility following the at least partial curing by UV elimination is a postexposure, by means of IR radiation, for example. At the end of this curing operation as per optional step (5-i) of the method of the invention, the film web (9) and the master film web (8) part from one another, with parting of the now structured layer composites (S2C2) and master film (S1C1). The coated film web (9) thus provided with the desired structuring (i.e., the composite (S2C2)) is supplied as a completed product to the film web roller (12) and is wound up on that roller. If there is illumination by means of a lighting unit (3) from outside onto the press roll (2), then the coated film web (9) provided with a desired structure (i.e., the composite (S2C2)) may also be opaque, if the arrangement is selected such that the master film web (8) (i.e., the composite (S1C1)) and the film web (9) (i.e., the composite (S2C2)) are switched. The coating of the coating application unit (27) in accordance with step (2-i) of the method of the invention may then take place without restriction of the operation onto the master film web (8).

Figure 2:
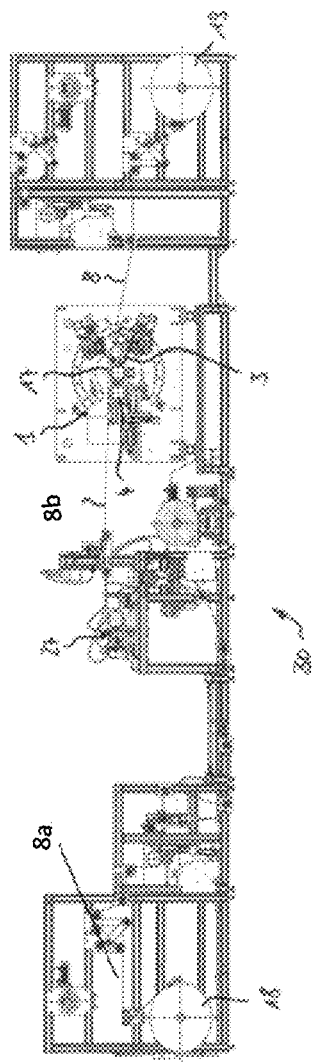

Production of Composite (S1C1):

The composite (S1C1) provided in step (1) of the inventive method can be prepared by various processes, for example lithographic methods, such as nanoimprint lithography, laser lithography and photo lithography. Preferred is the preparation of composite (S1C1) by steps (6) to (9) as specified in more detail hereinafter. Steps (6) to (9) of the method of the invention are therefore carried out for producing the composite (S1C1), which can be used as embossing mold (e2) of an embossing tool (E2). FIG. 2 provides an exemplary illustration of steps (6) to (9) of the method of the invention, as is also evident from the description of this figure below.

Optional Steps (6) to (9) of the Method of the Invention for Producing the Composite (S1C1)

According to a preferred embodiment of the present invention, the composite (S1C1) provided in step (1) of the method, composed of a substrate (S1) and of an at least partially embossed and at least partially cured coating (C1), is prepared by transferring the repeating and/or regularly arranged pattern of an embossing mold (e1) of an embossing tool (E1) to a coating composition (C1a), at least partially curing said coating composition and removing the structured and at least partially cured coating composition (i.e. composite (S1C1)) from the embossing tool. Thus, a preferred composite (S1C1) provided in step (1) is obtained by (6) applying the radiation-curable coating composition (C1a) to at least a part of the surface of a substrate (S1) to provide a composite (S1C1a);

(7) at least partially embossing the coating composition (C1a) applied at least partly to the surface of the substrate (S1) by means of at least one embossing tool (E1) comprising at least one embossing mold (e1);

(8) at least partially curing the at least partially embossed coating composition (C1a) applied at least partially to a substrate (S1) which throughout the duration of the at least partial curing is in contact with the at least one embossing mold (e1) of the embossing tool (E1);

(9) removing the composite (S1C1) from the embossing mold (e1) of the embossing tool (E1) to provide the at least partially embossed and at least partially cured composite (S1C1), or vice versa.

Step (6)

Step (6) of the method of the invention provides for application of a radiation-curable coating composition (C1a) to at least a part of a surface of a substrate (S1). The substrate (S1) constitutes a carrier material for the coating composition (C1a) or coating (C1), respectively. Suitable material for the substrate (S1) or for the surface layer thereof comprises the same materials which can also be used for producing the substrate (S2) as described above. Reference is hereby made explicitly to the corresponding passages. Further layers, for example adhesion promoting layers preferably being permeable to UV radiation can be present between (S1) and (C1) in the composite (S1C1). It is favorable, however, if no further layer is present between (S1) and (C1) in the composite (S1C1). The substrate (S1) is favorable a film web, preferably a moving film web or continuous film web, more preferably a continuous moving film web. In that case the substrate (S1) may be used preferably in a roll-to-roll (R2R) embossing apparatus. Preferred material for the substrate (S1) is polyester, more particularly polyethylene terephthalate (PET). The thickness of the substrate (S1) is preferably 2 μm up to 5 mm. Particularly preferred is a layer thickness of 25 to 1000 μm, more particularly 50 to 300 μm.

The coating composition (C1a) provided in optional step (6) of the inventive method is a radiation-curable coating composition, as described in detail below. Favorably, the coating composition (C1a) applied in step (6) is applied in a dry layer thickness of at least 0.5 μm, preferably at least 1 μm, and more preferably at least 5 μm up to 1.000 μm.

During implementation of step (6) (and preferably also during implementation of steps (7), (8) and (9) of the method) the substrate (S1) is preferably moving and is therefore a moving substrate. During the implementation of step (6), the substrate (S1) is moved preferably by means of a transport means such as a conveyor belt. The corresponding apparatus used for implementing step (6) therefore preferably comprises a transport means of this kind. The corresponding apparatus used for implementing step (6) further comprises a means for applying the preferably radiation-curable coating composition (C1a) to at least a part of a surface of the substrate (S1).

Step (7)

Step (7) of the method of the invention provides for at least partially embossing the coating composition (C1a), applied at least partially to the surface of the substrate (S1), by means of at least one embossing tool (E1) having at least one embossing mold (e1), optionally pre-wetted with coating composition (C1a). Said embossing mold (e1) can be a polymeric embossing mold (e1) or a metallic embossing mold (e1), preferably a metallic embossing mold (e1). Optionally, after a first composite (S1C1) has been produced, this first or earlier composite (S1C1) can be employed as embossing mold (e1). The at least partial embossing transfers an embossed structure at least partially to the surface of the coating composition (C1a) applied to the substrate (S1). The term "embossing" has been defined before, reference is explicitly made to the corresponding paragraphs.

Step (7) preferably transfers microstructures and/or nanostructures as embossed structure onto the coating composition (C1a) in dimensions such as structure width and structure height as described earlier. Reference is explicitly made to these earlier described passages.

The corresponding apparatus used for implementing step (7) therefore comprises a means for at least partially embossing the coating composition (C1a), applied at least partially to the surface of the substrate (S1), by means of at least one embossing tool (E1). The apparatus used preferably further comprises a means for pressing the embossing mold (e1) as part of the embossing tool (E1) onto the substrate (S1), used preferably in the form of continuous film web, after the application of the radiation-curable coating composition (C1a) to (S1), this means being situated preferably downstream of the means for applying the radiation-curable coating composition (C1a), as viewed in the direction of conveying of the substrate (S1).

The at least partial embossing as per step (7) of the method of the invention is carried out by means of an embossing tool (E1). The embossing tool (E1) may preferably be an embossing calender, which preferably comprises a grid application mechanism, more preferably a grid roll mechanism. This calender possesses counter-rotating rolls, preferably arranged above one another in the height direction with a certain spacing, and the composite (S1C1a) to be provided with an embossed structure is supplied to the rolls and is guided through the roll nip which forms, with the nip width being variably adjustable. The grid roll mechanism here preferably comprises a first roll such as a metallic roll, as for example a steel roll, a steel roll covered with a metal layer such as a copper layer or a nickel layer optionally containing small amounts of phosphorous, or a roll covered with a nickel sleeve which optionally contains small amounts of phosphorous, and a second roll. The first roll (embossing roll), as part of the embossing tool (E1), contains embossing molds (e1) having the mirror image of the embossed structure to be embossed into the surface of the composite (S1C1a). The image of the structure of the embossing mold (e1) therefore corresponds to the image embossed with composite (S1C1), preferably utilized as embossing mold (e2), into coating composition (C2a) in steps (3-i) or (2-ii). The second roll serves as an impression or pressing roll. At the point of the roll nip formed by the counter-rotating rolls disposed with a certain distance from one another, embossing takes place. The embossing tool (E1) used may also be a conventional press cylinder, preferably made of a metallic roll, as for example a steel roll, a steel roll covered with a metal layer such as a copper layer or a nickel layer optionally containing small amounts of phosphorous, which carries the mirror image of the embossed structure to be embossed into the surface of the composite (S1C1a) and can be pressed onto the composite (S1C1a) for the at least partial embossing. The mirror image is composed of a microstructured and/or nanostructured surface composed of microscale and/or nanoscale surface elements as described above in step (1). Reference is hereby made explicitly to the corresponding passages. The mirror image of the structure to be embossed is produced on the embossing tool (E1) according to the methods customary and known to the skilled person; depending on structure and materials, specific methods may be particularly advantageous. The composite (S1C1a) to be embossed, in the form for example of a film web coated at least partially with coating composition (C1a), is moved by means of the second roll or pressing roll counter-directionally to the first roll. At the point of the roll nip formed by the counter-rotating rolls disposed with a certain distance from one another, embossing takes place in accordance with step (7). The first roll, which carries the embossing mold (e1), serves here for embossing the composite (S1C1a) which is guided by the second roll, opposite this embossing roll, with the second roll pressing the composite (S1C1a), to be provided with an embossed structure, against the first embossing roll. The embossing tool (E1) is preferably a metallic embossing tool, more preferably made of steel, or a steel roll covered with a metal layer such as a copper layer or a nickel layer optionally containing small amounts of phosphorous, or a roll covered with a nickel sleeve which optionally contains small amounts of phosphorous. Accordingly, the embossing mold (e1) is preferably metallic, more preferably made of steel, copper or nickel, more particularly made of nickel which contains small amounts of phosphorus. Alternatively, however, the embossing mold (e1) may be composed of materials such as silicones (i.e. polydimethylsiloxanes (PDMS)) or, the composite (S1C1) previously made can be employed as embossing mold (e1) to multiply the pattern originally made in a first embossing to a first composite (S1C1). Moreover, rolls may be employed that are coated with at least one plastic. Furthermore, the embossing tool (E1) may have a structured coating such as a UV coating as embossing mold (e1).

If necessary, step (7) may be carried out at elevated temperatures, as for example at 30° C. to 100° C. or up to 80° C. In that case, the composite (S1C1a) runs first through a heating roll mechanism, followed optionally by irradiation with infrared light, before the actual embossing procedure, i.e. the curing while in contact with the embossing tool (E1), takes place. After the embossing and curing, the embossed composite (S1C1) runs optionally through a cooling roll mechanism for cooling. Alternatively, curing may also take place with cooling: in this case, the composite (S1C1a) for embossing runs first through a cooling roll mechanism, before the actual embossing procedure described before takes place. Instead of using a separate heating or curing roll mechanism, it is also possible to heat or cool the embossing tool (E1).

Step 8

Step (8) of the method of the invention provides for at least partially curing the at least partially embossed coating composition (C1a) applied at least partially to a substrate (S1) which throughout the duration of the at least partial curing is in contact with the at least one embossing mold (e1) of the embossing tool (E1).

Steps (7) and (8) are preferably carried out concurrently. In that case the curing as per step (8) takes place preferably in situ during the implementation of step (7).

The corresponding apparatus used for implementing step (8) therefore preferably comprises at least one radiation source for irradiating the radiation-curable coating composition (C1a) with a curative radiation, preferably UV radiation.

Examples of suitable radiation sources for the radiative curing have been described before with regard to curing of coating composition (C2a). Reference is hereby made explicitly to the corresponding passages.

The curing in step (8) takes place preferably by irradiation through the substrate (S1). In that case it is advantageous for the permeability of the substrate (S1) to the radiation used to be harmonized with that of the at least one photoinitiator comprised in coating composition (C1a). Thus, for example, the material PET as substrate (S1), hence a PET film, for example, is permeable to radiation having a wavelength of below 400 nm. Photoinitiators which generate radicals with such radiation include, for example, diphenyl(2,4,6-trimethylbenzoyl)phosphine oxide, ethyl (2,4,6-trimethyl-benzoyl) phenylphosphinate and phenylbis(2,4,6-trimethylbenzoyl) phosphine oxide.

Step (9)

Step (9) of the method of the invention provides for removal of the composite (S1C1) from the embossing tool (E1), so producing the desired product, namely the composite (S1C1) usable as embossing mold (e2) and composed of substrate (S1) and of at least partially embossed and at least partially cured coating (C1).

Optionally, the composites (S1C1) or master films can be post-exposed with a suitable radiation source, such as a UVA lamp, after separation from the embossing mold (e1), to increase or maximize the double bond conversion particularly at the surface of the coating (C1) of the composite (S1C1) to decrease or minimize covalent crosslinking with coating composition (C2a). Any of the radiation sources described earlier are suitable, reference is explicitly made to these earlier paragraphs.

Preferably, the surface of the at least partially cured and at least partially embossed coating (C1) of composite (S1C1) is a microstructured and/or nanostructured surface.

FIG. 2 shows schematically a side view of an apparatus which can be used for implementing steps (6) to (9) of the method of the invention for producing a composite (S1C1) favorably used as embossing mold (e2), i.e., for producing a master film, and which is used for exemplary illustration of the method of the invention in relation to steps (6) to (9). By means of this apparatus it is possible to transfer structures such as microstructures and/or nanostructures, by means of an embossing tool (E1), to a substrate (S1) coated with (C1a), and, after at least partial curing, to produce a composite (S1C1)—referred to as master film web (8) within FIG. 2—which can be used as master film, this composite being able to be used as embossing mold (e2) as described above in the method illustrated in association with FIG. 1.

The master transfer apparatus (30) shown in FIG. 2 operates according to a transfer principle wherein the desired negative structures are embossed directly, from a structured press cylinder or a press roll, which here is a master press cylinder (17), into the as yet uncured coating layer applied to the master film web (8*b*), corresponding to a composite (S1C1a), and this coating layer is then at least partially cured, with the structures applied thereon, curing taking place in situ by means of a lighting unit (3), to give the master film web (8)—corresponding to a composite (S1C1). In this method, the film web (8*a*) used as substrate (S1) is drawn off from a film web roller (18), which contains only the carrier material, in other words the pure film without applied master coating (C1a), and is guided via various deflection roller systems and web tensioning systems, and is introduced into an embossing region (1) of the apparatus. There, the film web (8*a*) runs from the coating application means (27), in which the as yet uncured master coating layer (corresponding to the coating composition (C1a)) is provided, into a press region between a pressing roll (4) and the master press cylinder (17). This application of coating corresponds to step (6) of the method of the invention. In the embossing region (1), in which the master film web (8*b*) with the as yet uncured master coating layer (C1a) runs along a section of the outer surface of the master press cylinder (17), the microscale and/or nanoscale surface elements of the microstructured and/or nanostructured surface embossed into the outer surface of the master press cylinder (17) are introduced as a negative image into the master coating layer of the master film web (8*b*) and are transferred. This corresponds to step (7) of the method of the invention. The master film web (8*b*) comprising the uncured coating composition (C1a) is then at least partially cured, in accordance with step (8) of the method of the invention. Curing here takes place in situ by irradiation with a lighting unit (3), by means of UV radiation, as for example by means of a unit formed of UV-LEDs. The resulting master film (8), in other words the composite (S1C1), is subsequently taken off, in accordance with step (9) of the method of the invention, from the outer surface of the master press cylinder (17), and the master film web (8) thus completed is spooled up onto a film web roller (19). The film web roller (19) then contains the completed master film web (8) with the master coating layer applied thereon and with the negative images of the microstructures and/or nanostructures embossed therein. This film web roller (19) can be removed and then used as first film web roller (6) in a transfer apparatus (10) in accordance with FIG. 1 or in another transfer apparatus operating with the same principle.

Inventively Employed Coating Compositions (C1a) and (C2a)

Coating Composition (C1a)

The coating composition (C1a) is a radiation-curable coating composition. The terms "radiation-curable" and "radiation-curing" are interchangeable here. The term "radiation-curing" refers preferably to radical polymerization of polymerizable compounds by virtue of electromagnetic and/or particulate radiation, examples being visible to (N)IR light in the wavelength range of $\lambda=400\text{-}1200$ nm, preferably 700-900 nm, and/or UV light in the wavelength range of $\lambda=100\text{-}400$ nm, preferably of $\lambda=200\text{-}400$ nm and more preferably $\lambda=250\text{-}400$ nm, and/or electron radiation in the range from 150 to 300 keV and more preferably with a radiation dose of at least 80 mJ/cm$^2$, preferably 80 to 3000 mJ/cm$^2$. Radiation curing is carried out with particular preference using UV radiation. The coating composition (C1a) may be cured by use of a suitable radiation source. Consequently, (C1a) is preferably a UV radiation-curing coating composition.

The coating composition (C1a) preferably comprises
(a) 5 to 45 weight % of at least one crosslinkable polymer and/or oligomer,
(b) 40 to 95 weight % of at least one reactive diluent,
(c) 0.01 to 15 weight % of at least one photoinitiator, and
(d) 0 to 5 weight % of at least one additive;
where (i) the stated total amounts of the components (a), (b), (c), and (d) are each based on the total weight of the coating composition (C1a), and (ii) the total amounts of all components present in the coating composition (C1a) add up to 100 weight %;
wherein the at least one crosslinkable polymer and/or oligomer (a) comprises a total amount of at least 25 weight %, preferably at least 50 weight %, more preferably at least 90 weight %, very preferably 100 weight %, based on the total weight of all crosslinkable polymer and/or oligomer comprised in the coating composition (C1a), of at least one silicone (meth)acrylate oligomer.

The coating compositions (C1a) comprises a total amount of 5 to 45 weight %, preferably 8 to 40 weight %, more preferably 9 to 35 weight %, based on the total weight of the coating composition (C1a), of at least one crosslinkable polymer and/or oligomer, wherein at least 25 weight %, preferably at least 50 weight %, more preferably at least 90 weight %, very preferably 100 weight %, based on the total weight off all crosslinkable polymer and/or oligomer comprised in the coating composition (C1a), of the at least one crosslinkable polymer and/or oligomer, is at least one silicone (meth)acrylate oligomer.

The term "oligomer" refers to relatively low molecular weight compounds consisting of few, typically 2 to less than 10 monomer units. The monomer units may be structurally identical or similar, or they can be different from each other. Oligomeric compounds are typically liquid at a room temperature of 23° C. and ambient pressure whereby the dynamic viscosity is preferably less than 500 Pa*s and more preferably less than 200 Pa*s at 23° C. measured according to DIN EN ISO 2555 (Brookfield method). The term "cross-linkable" refers to polymers or oligomers having on average at least one, preferably at least two, pending unsaturated groups capable of forming free radicals for crosslinking reactions. The cross-linkable oligomer and/or polymer compounds are preferably soluble in the one or more reactive diluents.

Silicone (meth)acrylate oligomers or polymers useful in the present invention can be typically prepared by condensation reaction between (meth)acrylic acid and hydroxyfunctional silicones (e. g. $\alpha,\omega$-polydimethylsilicone diols). Due to their silicone backbone silicone acrylates tend to improve the elasticity and elongation of the structured surfaces but impair their tensile strength and robustness. Higher functional silicone (meth)acrylates are often used due to their low surface energy properties. Examples of useful silicone (meth)acrylates include those commercially available from Sartomer Co. under the trade name SARTOMER (e.g., SARTOMER CN 9800), UCB Radcure Inc. under the EBECRYL trade name (e. g. EBECRYL 350, EBECRYL 1360 and as methacrylates from Shin-Etsu Silicones Europe B.V. under the product name X-22 (e.g., X-22-164, X-22-164A).

The coating composition (C1a) particularly preferably comprises a total amount of at least 25 weight %, preferably at least 50 weight %, more preferably at least 90 weight %, very preferably 100 weight %, based on the total weight off all crosslinkable polymer and/or oligomer comprised in the coating composition (C1a), of at least one silicone (meth)

acrylate oligomer, preferably exactly one silicone (meth) acrylate oligomer, more preferably exactly one silicone (meth)acrylate oligomer comprising on average 2 to 3 unsaturated groups.

Other crosslinkable polymer and/or oligomer optionally present in the coating composition (C1a), next to the silicone (meth)acrylates, are preferably selected from (meth)acrylated oligomer or polymer compounds, urethane (meth) acrylates, vinyl (meth)acrylates, epoxy (meth)acrylates, polyester (meth)acrylates, poly(meth)acrylates, polyether (meth)acrylates, olefin(meth)acrylates, (meth)acrylated oils, and mixtures thereof, preferably urethane (meth)acrylate oligomers. The coating composition (C1a) comprises a total amount of 0 to 75 weight %, preferably 0 to 50 weight %, more preferably 0 to 10 weight %, and very preferably 0 weight %, based on the total weight off all crosslinkable polymer and/or oligomer comprised in the coating composition (C1a), said other crosslinkable polymer and/or oligomers. In other words, the coating composition (C1a) comprises very preferably no other crosslinkable polymer and/or oligomers next to the at least one silicone (meth) acrylate.

Urethane (meth)acrylates are obtainable, for example, by reaction of polyisocyanates with hydroxyalkyl (meth)acrylates and optionally chain extenders such as diols, polyols, diamines, polyamines or dithiols or polythiols. Urethane (meth)acrylates dispersible in water without adding emulsifiers additionally contain ionic and/or nonionic hydrophilic groups, which are introduced into the urethane through synthesis components such as hydroxycarboxylic acids, for example. Such urethane (meth)acrylates contain essentially the following as synthesis components:
  (a) at least one organic aliphatic, aromatic or cycloaliphatic di- or polyisocyanate,
  (b) at least one compound having at least one isocyanate-reactive group, preferably a hydroxyl-bearing monomer, and at least one radically polymerizable unsaturated group, and
  (c) optionally at least one compound having at least two isocyanate-reactive groups, as for example a polyhydric alcohol.

The urethane (meth)acrylates preferably have a number-average molar weight Mn of 200 to 20 000, more particularly of 500 to 10 000, very preferably 600 to 3000 g/mol (determined by gel permeation chromatography with tetrahydrofuran as eluent and polystyrene as standard). The urethane (meth)acrylates contain preferably from 1 to 5, more preferably from 2 to 4 mol of (meth)acrylic groups per 1000 g of urethane (meth)acrylate.

Epoxide (meth)acrylates are obtainable by reaction of epoxides with (meth)acrylic acid. Examples of epoxides contemplated include epoxidized olefins, aromatic glycidyl ethers or aliphatic glycidyl ethers, preferably those of aromatic or aliphatic glycidyl ethers. Examples of possible epoxidized olefins include ethylene oxide, propylene oxide, isobutylene oxide, 1-butene oxide, 2-butene oxide, vinyloxirane, styrene oxide or epichlorohydrin; ethylene oxide, propylene oxide, isobutylene oxide, vinyloxirane, styrene oxide or epichlorohydrin are preferred, ethylene oxide, propylene oxide or epichlorohydrin are particularly preferred, and ethylene oxide and epichlorohydrin are especially preferred. Aromatic glycidyl ethers are, for example, bisphenol A diglycidyl ether, bisphenol F diglycidyl ether, bisphenol B diglycidyl ether, bisphenol S diglycidyl ether, hydroquinone diglycidyl ether, alkylation products of phenol/dicyclopentadiene, e.g., 2,5-bis[(2,3-epoxypropoxy) phenyl]octahydro-4,7-methano-5H-indene, tris[4-(2,3-epoxypropoxy)phenyl]methane isomers, phenol-based epoxy novolacs and cresol-based epoxy novolacs. Aliphatic glycidyl ethers are, for example, 1,4-butanediol diglycidyl ether, 1,6-hexanedioldiglycidyl ether, trimethylolpropane triglycidyl ether, pentaerythritol tetraglycidyl ether, 1,1,2,2-tetrakis[4-(2,3-epoxypropoxy)phenyl]ethane, diglycidyl ethers of polypropylene glycol ($\alpha,\omega$-bis(2,3-epoxypropoxy) poly(oxypropylene)) (and of hydrogenated bisphenol A (2,2-bis[4-(2,3-epoxypropoxy)cyclohexyl]propane)). The epoxide (meth)acrylates preferably have a number-average molar weight Mn of 200 to 20 000, more preferably of 200 to 10 000 g/mol and very preferably of 250 to 3000 g/mol; the amount of (meth)acrylic groups is preferably 1 to 5, more preferably 2 to 4, per 1000 g of epoxide (meth)acrylate (determined by gel permeation chromatography with polystyrene as standard and tetrahydrofuran as eluent).

(Meth)acrylated poly(meth)acrylates are the corresponding esters of a, $\beta$-ethylenically unsaturated carboxylic acids, preferably of (meth)acrylic acid, more preferably of acrylic acid, with polyacrylate polyols, obtainable by esterifying poly(meth)acrylate polyols with (meth)acrylic acid.

Carbonate (meth)acrylates are available with various functionalities. The number-average molecular weight Mn of the carbonate (meth)acrylates is preferably less than 3000 g/mol, more preferably less than 1500 g/mol, very preferably less than 800 g/mol (determined by gel permeation chromatography with polystyrene as standard and tetrahydrofuran as eluent). The carbonate (meth)acrylates are obtainable in a simple way by transesterification of carbonic esters with polyhydric, preferably dihydric, alcohols (diols, e.g., hexanediol) and subsequent esterification of the free OH groups with (meth)acrylic acid or else transesterification with (meth)acrylic esters, as described for example in EP 0 092 269 A1. They are also obtainable by reaction of phosgene, urea derivatives with polyhydric alcohols, dihydric alcohols for example. Also conceivable are meth(acrylates) of polycarbonate polyols, such as the reaction product of one of the stated diols or polyols and a carbonic ester and also a hydroxyl-containing (meth)acrylate. Examples of suitable carbonic esters are ethylene, 1,2- or 1,3-propylene carbonate, dimethyl, diethyl or dibutyl carbonate. Examples of suitable hydroxyl-containing (meth)acrylates are 2-hydroxyethyl (meth)acrylate, 2- or 3-hydroxypropyl (meth) acrylate, 1,4-butandiol mono(meth)acrylate, neopentyl glycol mono(meth)acrylate, glyceryl mono- and di(meth) acrylate, trimethylolpropane mono- and di(meth)acrylate and also pentaerythritol mono-, di- and tri(meth)acrylate. With preference the carbonate (meth)acrylates are aliphatic carbonate (meth)acrylates.

The coating composition (C1a) particularly preferably comprises a total amount of 5 to 45 weight %, preferably 8 to 40 weight %, more preferably 9 to 35 weight %, based on the total weight of the coating composition (C1a), of at least one crosslinkable polymer and/or oligomer selected from a group consisting of i) at least one silicone (meth)acrylate oligomer, preferably exactly one silicone (meth)acrylate oligomer, very preferably exactly one silicone (meth)acrylate oligomer comprising on average 2 to 3 unsaturated groups and ii) other crosslinkable polymer and/or oligomer selected from (meth)acrylated oligomer or polymer compounds, urethane (meth)acrylates, vinyl (meth)acrylates, epoxy (meth)acrylates, polyester (meth)acrylates, poly (meth)acrylates, polyether (meth)acrylates, olefin (meth) acrylates, (meth)acrylated oils, and mixtures thereof, preferably urethane (meth)acrylate oligomers.

Hence, the coating composition (C1a) particularly preferably comprises a total amount of at least 25 weight %, preferably at least 50 weight %, more preferably at least 90 weight %, based on the total weight off all crosslinkable polymer and/or oligomer comprised in the coating composition (C1a), of at least one silicone (meth)acrylate oligomer, especially exactly one silicone (meth)acrylate oligomer comprising on average 2 to 3 unsaturated groups, and less than 75 weight %, preferably less than 50 weight %, more preferably less than 10 weight %, based on the total weight off all crosslinkable polymer and/or oligomer comprised in the coating composition (C1a), other crosslinkable polymer and/or oligomer selected from (meth)acrylated oligomer or polymer compounds, urethane (meth)acrylates, vinyl (meth)acrylates, epoxy (meth)acrylates, polyester (meth)acrylates, poly(meth)acrylates, polyether (meth)acrylates, olefin (meth) acrylates, (meth)acrylated oils, and mixtures thereof, preferably urethane (meth)acrylate oligomers.

The coating composition (C1a) comprises a total amount of 40 to 85 weight % or 95 weight %, preferably 50 to 95 weight % or 85 weight % or 83 weight %, more preferably 55 to 83 weight %, based on the total weight of the coating composition (C1a), of at least one reactive diluent. Suitable reactive diluents are polymerizable with the polymer and/or oligomeric compounds to form a master substrate comprising a copolymerized elastomeric network of the cured master coating (C1). The term "reactive diluent" refers to low weight monomers which are able to participate in a polymerization reaction to form a polymeric material. The weight average molecular weight Mw of such monomer compounds preferably is less than 1000 g/mol and more preferably less than 750 g/mol, as determined by GPC.

Preferably, the reactive diluents are free-radically polymerizable monomers and include, for example, ethylenically-unsaturated monomers such as (meth)acrylates, styrene, vinyl acetate and mixtures thereof. Preferred monomers include (meth)acryloyl-functional monomers such as, for example, alkyl (meth)acrylates, aryloxyalkyl (meth)acrylates, hydroxyalkyl (meth)acrylates, N-vinyl compounds and combinations thereof. Suitable monomers are known to the person skilled in the art and are, for example, listed in WO 2012/006207 A1.

Particularly preferred coating compositions (C1a) comprise as reactive diluent at least one multifunctional ethylenically unsaturated monomer, i.e. a compound having at least two polymerizable double bonds in one molecule, in order to increase the crosslinking density. Representative examples of such multifunctional monomers are listed, for example, in WO 2012/006207 A1. Especially preferred reactive diluents are selected from hexane diol diacrylate and/or compounds comprising at least two, preferably at least three, more precisely exactly three, structural units which may be different from each other or at least partially identical, of the general formula (I)

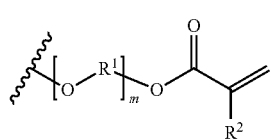

(I)

wherein
the radicals $R^1$, independently of each other, are $C_2$-$C_8$ alkylene groups, very preferably $C_2$ alkylene groups,
the radicals $R^2$, independently of each other, are H or methyl, and the parameters m, independently of each other, are an integral number in a range from 1 to 15, very preferably from 1 to 4 or 2 to 4, but with the proviso that in at least one of the structural units of the formula (I) the parameter m is at least 2, preferably exactly 2. Particularly preferable, said compound comprises 3 identical structural units of the general formula (I), wherein the parameter m is 2.

All structural units of general formula (I) are attached via the symbol

to the backbone of said reactive diluent. This bonding preferably takes place preferably via a linking of the oxygen atom of the radical —[O—$R^1$]$_m$— to a carbon atom of the backbone of the component. Thus, the at least two structural units of general formula (I) are present within a single component, namely the reactive diluent b). Suitable backbones are, for example, selected from neopentyl glycol, glycerin, trimethylolpropane, trimethylolethane or pentaerythritol.

Said compound preferably comprises a total number of ether groups of the general formula "—O—$R^1$" in a range from 4 to 18, more preferably in a range from 5 to 15, very preferably in a range from 6 to 12. Said compound preferably has a number average molecular weight (Mn) in the range from 300 to 2000 g/mol, more preferably from 400 to 1000 g/mol.

Said compound preferably has precisely three structural units of the formula (I). In that case said compound has precisely three functional (meth)acrylic groups. Alternatively, the structural units of the formula (I) may each also be present more than three times as part of said compound. In that case, for example, said compound may have more than three functional (meth)acrylic groups, as for example 4, 5 or 6 (meth)acrylic groups.

The aforementioned radicals $R^1$ each independently of one another are a $C_2$-$C_8$ alkylene group, preferably a $C_2$-$C_6$ alkylene group, more preferably a $C_2$-$C_4$ alkylene group, very preferably, each independently of one another, an ethylene group and/or a propylene group, especially preferably ethylene. In particular, all radicals $R^1$ are ethylene. Suitable as propylene groups in each case are radicals $R^1$ which have a structure —$CH_2$—$CH_2$—$CH_2$— or a structure —$CH(CH_3)$—$CH_2$— or a structure —$CH_2$—$CH(CH_3)$—. Particularly preferred in each case, however, is the propylene structure —$CH_2$—$CH_2$—$CH_2$—.

The parameters m, in each case independently of one another, are an integer in a range from 1 to 15. Since said compound has at least two, preferably at least three, of the structural units of the formula (I), and since the parameter m is at least 2 in at least one of the structural units of the formula (I), said compound includes a total of at least three, preferably at least four, ether groups of the general formula "—O—$R^1$—".

With preference said compound in total has at least five, more preferably at least six, ether groups of the general formula "—O—$R^1$—". The number of ether groups of the general formula "—O—$R^1$—" within said compound is situated preferably in a range from 4 to 18, more preferably in a range from 5 to 15, very preferably in a range from 6 to 12.

The fraction of the ether segments —[O—$R^1$]$_m$ present in the structural units of the formula (I) of said compound is in total at least 35 weight %, more preferably at least 38 weight %, very preferably at least 40 weight %, more preferably still at least 42 weight %, more particularly at least 45 weight %, based in each case on the total weight of said compound.

Said compound preferably has a number-average molecular weight (Mn) in the range from 300 to 2000 g/mol, more preferably from 350 to 1500 g/mol, more particularly from 400 to 1000 g/mol, as determined by GPC.

A particularly preferred multifunctional ethylenically unsaturated monomer is at least one compound of the general formula (IIa) and/or (IIb),

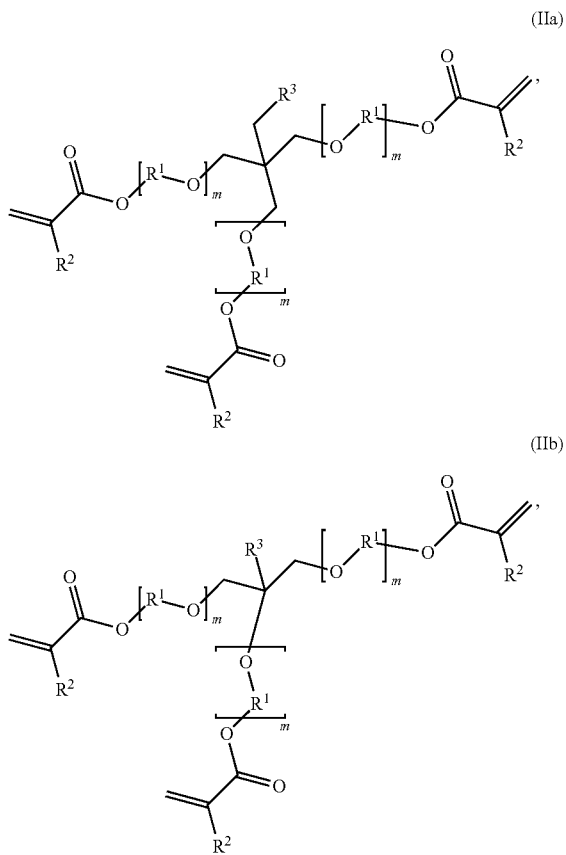

in which, in each case independently of one another,
- $R^1$ and $R^2$ and also m have the definitions given above in connection with the structural units (I), including the preferred embodiments stated above, and
- $R^3$ is H, $C_1$-$C_8$ alkyl, OH or O—$C_{1-8}$ alkyl, more preferably is $C_1$-$C_4$ alkyl, OH or O—$C_{1-4}$ alkyl, and very preferably is $C_1$-$C_4$ alkyl or OH, or
- $R^3$ is the radical —[O—$R^1$]$_m$—O—C(=O)—C($R^2$)=$CH_2$, in which $R^1$, $R^2$ and m have the definitions stated above in connection with the structural unit (I), including the preferred embodiments thereof stated above.

A particular preference is given to the use of a multifunctional ethylenically unsaturated monomer as reactive diluent of at least one compound of the general formula (IIa) in which
- the radicals $R^1$ each independently of one another are a $C_2$-$C_8$ alkylene group,
- the radicals $R^2$ each independently of one another are H or methyl,
- the parameters m, in each case independently of one another, are an integral parameter in a range from 1 to 15, preferably in a range from 1 to 10, more preferably in a range from 1 to 8 or 2 to 8, very preferably in a range from 1 to 6 or 2 to 6, more particularly in a range from 1 to 4 or 2 to 4, but with the proviso that in at least one and preferably in all of the structural units of the formula (I), the parameter m is at least 2.
- $R^3$ is $C_1$-$C_8$ alkyl, OH or O—$C_{1-8}$ alkyl, more preferably $C_1$-$C_4$ alkyl, OH or O—$C_{1-4}$ alkyl, very preferably $C_1$-$C_4$ alkyl or OH.

Especially preferred compounds comprising at least two structural units of general formula (I) are (meth)acrylates of neopentyl glycol, trimethylolpropane, trimethylolethane or pentaerythritol with a total of 4-fold to 20-fold or of 4-fold to 12-fold alkoxylation, such as ethoxylated, propoxylated or ethoxylated and propoxylated, and more particularly exclusively ethoxylated, neopentyl glycol, trimethylolpropane, trimethylolethane or pentaerythritol. The most preferred are corresponding (meth)acrylates derived from alkoxylated trimethylolpropane. Products of these kinds are available commercially and are sold for example under the designations Sartomer® SR 499 and Sartomer® SR 502 and also Sartomer® SR 415 and Sartomer® SR 9035 and also Sartomer® SR 501.

The coating composition (C1a) comprises a total amount of 40 to 95 weight %, preferably 50 to 85 weight %, more preferably 55 to 83 weight %, based on the total weight of the coating composition (C1a), of the at least one reactive diluent, preferably of hexane diol diacrylate and/or (meth)acrylates derived from 6-fold ethoxylated trimethylolpropane.

The coating composition (C1a) comprises a total amount of 0.01 to 15 weight %, preferably 0.5 to 10 weight %, more preferably 1 to 8 weight %, based on the total weight of the coating composition (C1a), of at least one photoinitiator, for the curing by means of visible to (N)IR- and/or UV light. This photoinitiator can be broken down, by light of the irradiated wavelength, into radicals, which are able in turn to initiate a radical polymerization. In the case of curing with electron radiation, conversely, there is no need for the presence of such photoinitiators. The coating composition (C1a) preferably includes at least one photoinitiator which can be broken down, by light of the irradiated wavelength, into radicals which are able in turn to initiate a radical polymerization.

Photoinitiators such as UV photoinitiators are known to the skilled person. Examples of those contemplated include phosphine oxides such as (alkyl)-benzoylphenylphosphine oxides, benzophenones, α-hydroxyalkyl aryl ketones, thioxanthones, anthraquinones, acetophenones, benzoins and benzoin ethers, ketals, imidazoles or phenylglyoxylic acids and mixtures thereof.

Phosphine oxides are, for example, monoacyl- or bisacylphosphine oxides, as for example diphenyl(2,4,6-trimethylbenzoyl)phosphin oxide, ethyl (2,4,6-trimethylbenzoyl)phenylphosphinate, phenyl bis(2,4,6-trimethylbenzoyl)-phosphine oxide or bis(2,6-dimethoxybenzoyl)(2,4,4-trimethylpentyl)phosphine oxide. Benzophenones are, for example, benzophenone, 4-aminobenzophenone, 4,4'-bis(dimethylamino)benzophenone, 4-phenylbenzophenone, 4-chlorobenzophenone, Michler's ketone, o-methoxybenzophenone, 2,4,6-trimethylbenzophenone, 4-methylbenzophenone, 2,4-dimethylbenzophenone, 4-isopropylbenzophenone, 2-chlorobenzophenone, 2,2'-dichlorobenzophenone, 4-methoxybenzophenone, 4-propoxybenzophenone or 4-butoxybenzophenone; α-hydroxyalkyl aryl ketones are, for example, 1-benzoylcyclohexan-1-ol (1-hydroxycyclohexyl phenyl ketone), 2-hydroxy-2,2-dimethylacetophenone (2-hydroxy-2-methyl-1-phenylpropan-1-one), 1-hydroxyacetophenone, 1-[4-(2-hydroxyethoxy)phenyl]-2-hydroxy-2-methyl-1-propan-1-one or a polymer containing in copolymerized form 2-hydroxy-2-methyl-1-(4-isopropen-2-ylphenyl)propan-1-one. Xanthones and thioxanthones are, for example, 10-thioxanthenone, thioxanthen-9-one, xanthen-9-one, 2,4-dimethylthioxanthone, 2,4-diethylthioxanthone, 2,4-diisopropylthioxanthone, 2,4-dichlorothioxanthone or chloroxanthenone; anthraquinones are, for example, β-methylanthraquinone, tert-butylanthraquinone, anthraquinonecarboxylic esters, benz[de]anthracen-7-one, benz[a]anthracene-7,12-dione, 2-methylanthraquinone, 2-ethylanthraquinone, 2-tert-butylanthraquinone, 1-chloroanthraquinon or 2-amylanthraquinone. Acetophenones are, for example, acetophenone, acetonaphthoquinone, valerophenone, hexanophenone, α-phenylbutyrophenone, p-morpholinopropiophenone, dibenzosuberone, 4-morpholinobenzophenone, p-diacetylbenzene, 4'-methoxyacetophenone, α-tetralone, 9-acetylphenanthrene, 2-acetylphenanthrene, 3-acetylphenanthrene, 3-acetylindole, 9-fluorenone, 1-indanone, 1,3,4-triacetylbenzene, 1-acetonaphthone, 2-acetonaphthone, 2,2-dimethoxy-2-phenylacetophenone, 2,2-diethoxy-2-phenylacetophenone, 1,1-dichloroacetophenone, 1-hydroxyacetophenone, 2,2-diethoxyacetophenone, 2-methyl-1-[4-(methylthio)phenyl]-2-morpholinopropan-1-one, 2,2-dimethoxy-1,2-diphenylethan-2-one or 2-benzyl-2-dimethylamino-1-(4-morpholinophenyl)-butan-1-one. Benzoins and benzoin ethers are, for example, 4-morpholinodeoxybenzoin, benzoin, benzoin isobutyl ether, benzoin tetrahydropyranyl ether, benzoin methyl ether, benzoin ethyl ether, benzoin butyl ether, benzoin isopropyl ether or 7H-benzoin methyl ether. Ketals are, for example, acetophenone dimethyl ketal, 2,2-diethoxyacetophenone, or benzil ketals, such as benzil dimethyl ketal. Typical mixtures comprise, for example, 2-hydroxy-2-methyl-1-phenylpropan-2-one and 1-hydroxycyclohexyl phenyl ketone, bis(2,6-dimethoxybenzoyl)(2,4,4-trimethylpentyl)phosphine oxide and 2-hydroxy-2-methyl-1-phenylpropan-1-one, benzophenone and 1-hydroxycyclohexylphenyl ketone, bis(2,6-dimethoxybenzoyl)(2,4,4-trimethylpentyl)phosphine oxide and 1-hydroxycyclohexyl phenyl ketone, diphenyl(2,4,6-trimethylbenzoyl)phosphine oxide and 2-hydroxy-2-methyl-1-phenylpropan-1-one, 2,4,6-trimethylbenzophenone and 4-methylbenzophenone or 2,4,6-trimethylbenzophenone and 4-methylbenzophenone and diphenyl(2,4,6-trimethylbenzoyl)phosphine oxide.

Particularly preferred photoinitiators are diphenyl(2,4,6-trimethylbenzoyl)phosphine oxide, ethyl (2,4,6-trimethylbenzoyl)phenylphosphinate, phenylbis(2,4,6-trim ethylbenzoyl) phosphine oxide, bis(2,6-dimethoxybenzoyl)(2,4,4-trimethylpentyl)phosphine oxide, 1-hydroxycyclohexyl phenyl ketone, benzophenone, 1-benzoylcyclohexan-1-ol, 2-hydroxy-2,2-dimethylacetophenone and 2,2-dimethoxy-2-phenylacetophenone and mixtures thereof. Commercially available photoinitiators are, for example, the products Irgacure® 184, Irgacure® 500, Irgacure® TPO, Irgacure® TPO-L and Lucirin® TPO and also Darocure® 1173 from IGM Resins B.V.

The coating composition (C1a) can optionally further comprise at least one additive. The concept of the additive is known to the skilled person, from Römpp Lexikon "Lacke und Druckfarben", Thieme Verlag, 1998, page 13, for example. A preferred additive used is at least one rheology additive. This term as well is known to the skilled person, from Römpp Lexikon "Lacke und Druckfarben", Thieme Verlag, 1998, page 497, for example. The terms "rheology additive", "rheological additive" and "rheology assistant" are interchangeable here. The optional additive is preferably selected from the group consisting of flow control agents, surface-active agents such as surfactants, wetting agents and dispersants, and also thickeners, thixotropic agents, plasticizers, lubricity and antiblocking additives, and mixtures thereof. These terms are likewise known to the skilled person, from Römpp Lexikon, "Lacke und Druckfarben", Thieme Verlag, 1998, for example. Flow control agents are components which by lowering the viscosity and/or surface tensions help coating materials to form films which flow out evenly. Wetting agents and dispersants are components which lower the surface tension or, generally, the interfacial tension. Lubricity and antiblocking additives are components which reduce mutual sticking (blocking).

Examples of commercially available additives are the products Efka® SL 3259, Byk® 377, Tego® Rad 2500, Tego® Rad 2800, Byk® 394, Byk-SILCLEAN 3710, Silixan® A250, Novec FC 4430 and Novec FC 4432. Suitable total amounts of the at least one additive are, for example, 0.01 to 5 weight %, 0.2 or 0.5 to 3 weight %, based on the total weight of the coating composition (C1a).

In context of this invention, an additive, such as a surface agent, may comprise silicone (meth)acrylates. Such an additive comprising silicone (meth)acrylates is not to be compared with the crosslinkable silicone (meth)acrylate oligomers used as crosslinkable polymer and/or oligomer, minimally by the small total amount the additive is comprised in the coating composition, but also from the different chemical functionality or reactivity of the silicone (meth)acrylate additive having a totally different technical effect on the coating composition. An additive comprising silicone (meth)acrylate has for instance only an effect on the surface energy of the coating composition but only marginally contributes to the backbone of the (co-)polymerized network formed by the crosslinkable polymer and/or oligomer or reactive diluent. In contrast to an additive comprising a silicone (meth)acrylate, the silicone (meth)acrylate oligomer employed as crosslinkable polymer and/or oligomer comprises pending unsaturated groups capable of forming free radicals for crosslinking reactions and forms with the reactive diluents the copolymerized elastomeric network of the cured master coating ($C_1$).

Particularly preferably, the components (a), (b), (c), and (d), comprised in the coating composition (C1a), are each different from one another and therefore not identical.

Particularly preferred master coatings (C1a) thus comprise—based on the total weight of coating composition (C1a)—the following components:
- 9 to 35 weight % of exactly one silicone (meth)acrylate oligomer comprising on average 2 unsaturated groups,
- 55 to 83 weight % of hexane diol diacrylate and/or (meth)acrylates derived from 6-fold ethoxylated trimethylolpropane (i.e. compounds comprising three structural units of general formula (I)),
- 1 to 10 weight % of ethyl (2,4,6-trimethylbenzoyl)phenylphosphinate and/or 1-benzoylcyclohexan-1-ol and
- 0 or 0.5 to 3 weight % of an lubricity and antiblocking additive.

The double bond conversion of the at least partially cured coating (C1) obtained from (C1a) is preferably at least 70%, more preferably at least 75%, more preferably still at least 80%, very preferably at least 85%, more particularly at least 90%.

The coating composition (C1a) may comprise at least one further component (e), different from the components (a) to (d), such as, for example, fillers, pigments, thermally activatable initiators such as, for example, potassium peroxodisulfate, dibenzoyl peroxide, cyclohexanone peroxide, di-tert-butyl peroxide, azobisisobutyronitrile, cyclohexylsulfonyl acetyl peroxide, diisopropyl percarbonate, tert-butyl peroctoate or benzpinacol, cumene hydroperoxide, dicumyl peroxide, tert-butyl perbenzoate, silylated pinacols, alkoxyamines, and organic solvents, and also stabilizers. Preferably, however, there are no organic solvents included in coating composition (C1a). The coating composition (C1a) may comprise the at least one component (e) in a total amount of 0 to 10 weight %, preferably 0 to 5 weight %, more preferably 0 to 1 weight %, based on the total weight of the coating composition (C1a).

Coating composition (C1a) can be a solvent-based or a solid coating composition. In order to facilitate rapid curing and to prevent generation of high amounts of evaporating solvents upon curing, the coating composition (C1a) is preferably a solid coating composition. Thus, coating composition (C1a) favorably comprises a total amount of less than 10 weight %, preferably less than 5 weight %, more preferably less than 1 weight %, very preferably 0 weight % or no solvents, based on the total weight of the coating composition (C1a). Thus, coating composition (C1a) favorably has a solids content of 75 to 100 weight %, based on the total weight of the coating composition (C1a), as determined according to DIN EN ISO 3251:2008-06 at 125° C. and 60 min. Moreover, it favorably comprises a total amount of compounds (a), (b), (c) and optionally (d) of 90 to 100 weight %, preferably 95 to 100 weight %, more preferably 99 to 100 weight % based on the total weight of the coating composition (C1a). Most preferably, coating composition (C1a) consists of compounds (a), (b), (c), and optional (d).

The coating composition (C1a) preferably contains no thiols, and especially no trimethylolpropane tris(3-mercaptopropionate).

Coating Composition (C2a)

Any kind of coating composition may be employed as coating composition (C2a) in step (2-i) or (2-ii) of the method of the invention. The coating composition (C2a) may be a physically drying, thermally curable, chemically curable and/or radiation-curable coating composition (C2a). With preference the coating composition (C2a) is a chemically curable, a thermally curable and/or radiation-curable coating composition, more preferably a radiation-curable coating composition. Accordingly, the at least partial curing as per step (4) takes place preferably by means of radiation curing. The coating composition (C2a) may be identical to the coating composition (C1a). Preferably, however, (C2a) is different from (C1a). (C2a) is preferably constructed from the alike, but not the same, components (a) to (e) also used in the preparation of (C1a), although the quantity provisos relating to (C1a) do not have to apply to (C2a).

Physical drying here refers preferably to the simple evaporation of solvent(s) to form the coating (C2). Thermal curing here preferably entails a curing mechanism which is attributable to a temperature above room temperature (>23° C.). This may be, for example, the formation of radicals or ions, preferably radicals from an initiator which breaks down at the elevated temperatures and so initiates a radical or ionic polymerization. Examples of such thermally activatable initiators are those which have a half-life at 80° C. of less than 100 hours. Chemical curing refers preferably to the reaction of at least two different and mutually complementary reactive functional groups, in the manner, for example, of a polycondensation such as a reaction of an —OH group with a —COOH group, or of a polyaddition (reaction of an NCO group with an —OH or amino group).

If the coating composition (C2a) is a physically drying, thermally curable and/or chemically curable coating composition, it is prepared using, as binder, at least one customary polymer known to the skilled person. In case of thermally or chemically curable coating compositions, this binder then preferably has crosslinkable functional groups. Any customary crosslinkable functional group known to the skilled person is suitable in this context. More particularly the crosslinkable functional groups are selected from the group consisting of hydroxyl groups, amino groups, carboxylic acid groups, thiol groups, isocyanates, polyisocyanates and epoxides. The polymers are preferably curable or crosslinkable exothermically or endothermically, preferably in a temperature range from −20° C. up to 250° C., or from 18° C. to 200° C. Especially suitable as polymers are at least one polymer selected from the group consisting of polyurethanes, polyethers, polyesters, polyamides, polyureas, polyvinyl chlorides, polystyrenes, polycarbonates, poly(meth) acrylates, epoxy resins, phenol-formaldehyde resins, melamine-formaldehyde resins. These polymers may in particular be OH-functional. In that case they may be subsumed by the general term "polyols". Such polyols may for example be poly(meth)acrylate polyols, polyester polyols, polyether polyols, polyurethane polyols, polyurea polyols, polyester-polyacrylate polyols, polyester-polyurethane polyols, polyurethane-polyacrylate polyols, polyurethane-modified alkyd resins, fatty acid-modified polyester-polyurethane polyols, and also mixtures of the stated polyols. Preferred are poly(meth)acrylate polyols, polyester polyols and polyether polyols.

It is possible here to use at least one polymer which is cured with participation of isocyanate and/or oligomerized isocyanate groups, very preferably at least one corresponding polyurethane and/or at least one corresponding polyurea (e.g., what are called "polyaspartic binders"). Polyaspartic binders are components which are converted from reaction of amino-functional compounds, especially secondary amines, with isocyanates. If at least one polyurethane is used, then those suitable especially are polyurethane-based resins which are preparable by a polyaddition reaction between hydroxyl-containing components such as polyols and at least one polyisocyanate (aromatic and aliphatic isocyanates, di-, tri- and/or polyisocyanates). Customarily here a stoichiometric conversion of the OH groups in the polyols with the NCO groups in the polyisocyanates is required. However, the stoichiometric ratio to be used can also be varied, since the polyisocyanate can be added to the polyol component in amounts such that there may be an "over crosslinking" or an "under crosslinking". If epoxy resins are used, i.e. epoxide-based resins, then those suitable are preferably epoxide-based resins which are prepared from glycidyl ethers which have terminal epoxide groups and, within the molecule, hydroxyl groups as functional groups. These are preferably reaction products of bisphenol A and epichlorohydrin and/or of bisphenol F with epichlorohydrin, and mixtures thereof, which are also used in the presence of reactive diluents. The curing or crosslinking of such epoxide-based resins is accomplished customarily by a polymerization of the epoxide groups of the epoxide ring, by a polyaddition reaction in the form of an addition reaction of other reactive compounds, as hardeners, in stoichiometric amounts with the epoxide groups, in which case, accordingly, the presence of one active hydrogen equivalent per epoxide group is required (i.e., one H-active equivalent is needed for curing per epoxide equivalent), or by a polycondensation via the epoxide groups and the hydroxyl groups. Examples of suitable hardeners are polyamines, especially (hetero)aliphatic, (hetero)aromatic and (hetero)cycloaliphatic polyamines, polyamidoamines, polyaminoamides, and also polycarboxylic acids and their anhydrides.

The concept of "radiation curing" has already been described above in connection with the coating composition (C1a), reference is explicitly made to the passages thereof.

The coating composition (C2a) may be cured by use of a radiation source, preferably by using UV radiation. Preferably, therefore, (C2a) is a UV radiation-curing coating composition.

Thus, a preferred product coating composition (C2a) comprises
  a) at least one compound having on average at least two unsaturated groups,
  b) optionally at least one photoinitiator and
  c) optionally at least one additive.

Coating composition (C2a) preferably has on average at least two unsaturated carbon double bonds, more preferably (meth)acrylic groups. For this purpose, the coating composition (C2) may comprise any of the crosslinkable polymers and/or oligomers or reactive diluents identified above in connection with (C1a), such as, in particular, polyesters, polyethers, carbonates, epoxides, poly(meth)acrylates, urethane (meth)acrylates, and/or silicone (meth)acrylate oligomers and/or at least one unsaturated polyester resin and/or mono-, di- and/or tri-functional (meth)acrylic esters.

On curing by means of visible to (N)IR and/or UV light, the coating composition (C2a) preferably comprises at least one photoinitiator which is able to be broken down into radicals by light of the irradiated wavelength, these radicals then being able to initiate a radical polymerization. In the case of curing with electron radiation, in contrast, the presence of such photoinitiators is not necessary. As photoinitiators it is possible to use the same components in the same quantities as stated above in connection with the photoinitiators of the coating composition (C1a).

The coating composition (C2a) may comprise at least one further additive. In that case, it is possible to use the same components in the same amounts as identified above as additive or further component (e) of the coating composition (C1a).

The coating composition used as coating composition (C2a) is more preferably one having (meth)acrylic groups. With preference this coating composition (C2a) comprises at least one urethane (meth)acrylate. Preferably, moreover, it includes at least one photoinitiator.

Coating composition (C2a) can be a solvent-based or a solid coating composition. In order to facilitate rapid curing and to prevent generation of high amounts of evaporating solvents upon curing, the coating composition (C2a) is preferably a solid coating composition or a coating composition containing a low amount of solvents. Thus, it favorably has solids content of 75 to 100% by weight, based on the total weight of the coating composition (C2a), as determined according to DIN EN ISO 3251:2008-06 at 125° C. and 60 min. Moreover, it favorably comprises a total amount of compound (a), and optional compounds (b) and (c) of 90 to 100 weight %, preferably 95 to 100 weight %, more preferably 99 to 100 weight % based on the total weight of the coating composition (C2a).

Composite (S1C1) of the Invention

A further subject of the present invention is a composite (S1C1) composed of a substrate (S1) and an at least partially embossed and at least partially cured coating (C1), wherein the coating (C1) is obtainable by at least partially curing a coating composition (C1a) applied to at least a part of a surface of the substrate (S1) and at least partially embossing, by radiation curing, wherein the coating composition (C1a) is a radiation-curable coating composition, comprising
  (a) 5 to 45 weight % of at least one crosslinkable polymer and/or oligomer,
  (b) 40 to 95 weight % or 85 weight %, preferably 50 to 95 weight % or 85 weight % or 83 weight %, of at least one reactive diluent,
  (c) 0.01 to 15 weight % of at least one photoinitiator, and
  (d) 0 to 5 weight % of at least one additive;
where (i) the stated total amounts of the components (a), (b), (c), and (d) are each based on the total weight of the coating composition (C1a), and (ii) the total amounts of all components present in the coating composition (C1a) add up to 100 weight %;
wherein the at least one crosslinkable polymer and/or oligomer (a) comprises a total amount of at least 25 weight %, preferably at least 50 weight %, more preferably at least 90 weight %, very preferably 100 weight %, based on the total weight of all crosslinkable polymer and/or oligomer comprised in the coating composition (C1a), of at least one silicone (meth)acrylate oligomer.

Preferably, all components (a), (b), (c), and (d) are each different from one another.

All preferred embodiments described hereinabove in connection with the method of the invention, especially in connection with the coating composition (C1a) used therein and with the substrate (S1) and also of the coating ($C_1$), are also preferred embodiments in relation to the composite (S1C1) of the invention.

The composite (S1C1) of the invention is obtainable preferably by implementation of the above-described method steps (6) to (9) of the method of the invention. The substrate (S1) is favorably a film web, preferably a moving film web, more preferably a continuous moving film web.

Use According the Invention

A further subject of the present invention is a use of the composite (S1C1) of the invention as embossing mold (e2) of an embossing tool (E2) for transferring an embossed structure to at least a part of a surface of a coating composition (C2a), or to at least a part of a surface of a coating composition (C2a) which is at least partly applied on a substrate (S2).

All preferred embodiments described hereinabove in connection with the method of the invention and the composite (S1C1) of the invention are also preferred embodiments in relation to the aforementioned use of the composite (S1C1) of the invention.

The coating composition (C2a) here is preferably a radiation-curable coating composition.

The invention is described in particular by the following embodiments:

Embodiment 1: A method for transferring an embossed structure to at least a part of a surface of a coating composition (C2a) using a composite (S1C1), said method comprising at least the steps (1), (2-i) and (3-i) or (2-ii) and (3-ii), and also at least step (4) and optionally step (5-i) or (5-ii), specifically:

(1) providing a composite (S1C1) composed of a substrate (S1) and an at least partially embossed and at least partially cured coating (C$_1$); and
(2-i) applying at least one coating composition (C2a) to at least a part of a surface of a substrate (S2) to provide composite (S2C2a);
(3-i) at least partially embossing the coating composition (C2a) of the composite (S2C2a) using composite (S1C1) to provide composite (S1C1C2aS2); or
(2-ii) applying at least one coating composition (C2a) to at least a part of an at least partially embossed and at least partially cured surface of composite (S1C1) and at least partially embossing the coating composition (C2a) using composite (S1C1) to provide composite (S1C1C2a);
(3-ii) optionally applying a substrate (S2) to at least a part of the surface, formed by coating composition (C2a), of the composite (S1C1C2a) to give a composite (S1C1C2aS2); and
(4) at least partially curing the at least partially embossed coating composition (C2a) optionally applied to a substrate (S2) which throughout the duration of the at least partial curing is in contact with the composite (S1C1) to provide a composite (S1C1C2) or (S1C1C2S2); and
(5-i) optionally removing composite (C2S2) within the composite (S1C1C2S2) from the composite (S1C1) to restore the composite (S1C1) provided in step (1); or
(5-ii) optionally removing coating (C2) within the composite (S1C1C2) from the composite (S1C1) to restore the composite (S1C1) provided in step (1);
wherein a coating composition (C1a) used for producing the at least partially embossed and at least partially cured coating (C1) of the composite (S1C1) used in step (1) and restored in step (5-i) or step (5-ii) is a radiation-curable coating composition, comprising
(a) 5 to 45 weight % of at least one crosslinkable polymer and/or oligomer,
(b) 40 to 95 weight % of at least one reactive diluent,
(c) 0.01 to 15 weight % of at least one photoinitiator, and
(d) 0 to 5 weight % of at least one additive;
where (i) the stated total amounts of the components (a), (b), (c), and (d) are each based on the total weight of the coating composition (C1a), and (ii) the total amounts of all components present in the coating composition (C1a) add up to 100 weight %;
wherein the at least one crosslinkable polymer and/or oligomer (a) comprises a total amount of at least 25 weight %, preferably at least 50 weight %, more preferably at least 90 weight %, very preferably 100 weight %, based on the total weight of all crosslinkable polymer and/or oligomer comprised in the coating composition (C1a), of at least one silicone (meth)acrylate oligomer.

Embodiment 2: A method for transferring an embossed structure to at least a part of a surface of a coating composition (C2a) using a composite (S1C1), said method comprising at least the steps (1), (2-i) and (3-i), and also at least step (4) and optionally step (5-i), specifically:
(1) providing a composite (S1C1) composed of a substrate (S1) and an at least partially embossed and at least partially cured coating (C$_1$);
(2-i) applying at least one coating composition (C2a) to at least a part of a surface of a substrate (S2) to provide composite (S2C2a);
(3-i) at least partially embossing the coating composition (C2a) of the composite (S2C2a) using composite (S1C1) to provide composite (S1C1C2aS2);
(4) at least partially curing the at least partially embossed coating composition (C2a) optionally applied to a substrate (S2) which throughout the duration of the at least partial curing is in contact with the composite (S1C1) to provide a composite (S1C1C2S2);
(5-i) optionally removing composite (C2S2) within the composite (S1C1C2S2) from the composite (S1C1) to restore the composite (S1C1) provided in step (1);
wherein a coating composition (C1a) used for producing the at least partially embossed and at least partially cured coating (C1) of the composite (S1C1) used in step (1) and restored in step (5-i) is a radiation-curable coating composition, comprising
(a) 5 to 45 weight % of at least one crosslinkable polymer and/or oligomer,
(b) 40 to 95 weight % of at least one reactive diluent,
(c) 0.01 to 15 weight % of at least one photoinitiator, and
(d) 0 to 5 weight % of at least one additive;
where (i) the stated total amounts of the components (a), (b), (c), and (d) are each based on the total weight of the coating composition (C1a), and (ii) the total amounts of all components present in the coating composition (C1a) add up to 100 weight %;
wherein the at least one crosslinkable polymer and/or oligomer (a) comprises a total amount of at least 25 weight %, preferably at least 50 weight %, more preferably at least 90 weight %, very preferably 100 weight %, based on the total weight of all crosslinkable polymer and/or oligomer comprised in the coating composition (C1a), of at least one silicone (meth)acrylate oligomer.

Embodiment 3: A method for transferring an embossed structure to at least a part of a surface of a coating composition (C2a) using a composite (S1C1), said method comprising at least the steps (1), (2-ii), and also at least step (4) and optionally step (5-ii), specifically:
(1) providing a composite (S1C1) composed of a substrate (S1) and an at least partially embossed and at least partially cured coating (C$_1$);
(2-ii) applying at least one coating composition (C2a) to at least a part of an at least partially embossed and at least partially cured surface of composite (S1C1) and at least partially embossing the coating composition (C2a) using composite (S1C1) to provide composite (S1C1C2a);
(4) at least partially curing the at least partially embossed coating composition (C2a) which throughout the duration of the at least partial curing is in contact with the composite (S1C1) to provide a composite (S1C1C2); and
(5-ii) optionally removing coating (C2) within the composite (S1C1C2) from the composite (S1C1) to restore the composite (S1C1) provided in step (1);
wherein a coating composition (C1a) used for producing the at least partially embossed and at least partially cured coating (C1) of the composite (S1C1) used in step (1) and restored in step (5-ii) is a radiation-curable coating composition, comprising
(a) 5 to 45 weight % of at least one crosslinkable polymer and/or oligomer,
(b) 40 to 95 weight % of at least one reactive diluent,
(c) 0.01 to 15 weight % of at least one photoinitiator, and
(d) 0 to 5 weight % of at least one additive;
where (i) the stated total amounts of the components (a), (b), (c), and (d) are each based on the total weight of the coating composition (C1a), and (ii) the total amounts of all components present in the coating composition (C1a) add up to 100 weight %;
wherein the at least one crosslinkable polymer and/or oligomer (a) comprises a total amount of at least 25 weight %, preferably at least 50 weight %, more preferably at least 90 weight %, very preferably 100 weight %, based on the total weight of all crosslinkable polymer and/or oligomer comprised in the coating composition (C1a), of at least one silicone (meth)acrylate oligomer.

Embodiment 4: A method for transferring an embossed structure to at least a part of a surface of a coating composition (C2a) using a composite (S1C1), said method comprising at least the steps (1), (2-ii) and (3-ii), and also at least step (4) and optionally step (5-ii), specifically:
- (1) providing a composite (S1C1) composed of a substrate (S1) and an at least partially embossed and at least partially cured coating (C1);
- (2-ii) applying at least one coating composition (C2a) to at least a part of an at least partially embossed and at least partially cured surface of composite (S1C1) and at least partially embossing the coating composition (C2a) using composite (S1C1) to provide composite (S1C1C2a);
- (3-ii) applying a substrate (S2) to at least a part of the surface, formed by coating composition (C2a), of the composite (S1C1C2a) to give a composite (S1C1C2aS2);
- (4) at least partially curing the at least partially embossed coating composition (C2a) applied to a substrate (S2) which throughout the duration of the at least partial curing is in contact with the composite (S1C1) to provide a composite (S1C1C2S2);
- (5-i) optionally removing composite (C2S2) within the composite (S1C1C2S2) from the composite (S1C1) to restore the composite (S1C1) provided in step (1);

wherein a coating composition (C1a) used for producing the at least partially embossed and at least partially cured coating (C1) of the composite (S1C1) used in step (1) and restored in step (5-i) is a radiation-curable coating composition, comprising
- (a) 5 to 45 weight % of at least one crosslinkable polymer and/or oligomer,
- (b) 40 to 95 weight % of at least one reactive diluent,
- (c) 0.01 to 15 weight % of at least one photoinitiator, and
- (d) 0 to 5 weight % of at least one additive where (i) the stated total amounts of the components (a), (b), (c), and (d) are each based on the total weight of the coating composition (C1a), and (ii) the total amounts of all components present in the coating composition (C1a) add up to 100 weight %.
wherein the at least one crosslinkable polymer and/or oligomer (a) comprises a total amount of at least 25 weight %, preferably at least 50 weight %, more preferably at least 90 weight %, very preferably 100 weight %, based on the total weight of all crosslinkable polymer and/or oligomer comprised in the coating composition (C1a), of at least one silicone (meth)acrylate oligomer;

Embodiment 5: The method according to any of embodiments 1 to 4, wherein the at least one coating composition (C2a) in step (2-i) and step (2-ii) is applied in a dry layer thickness of at least 0.5 µm, preferably at least 1 µm, more preferably at least 5 µm.

Embodiment 6: The method according to any of embodiments 1 to 5, wherein the embossed structure to be transferred is a microstructure and/or nanostructure, preferably having a structure width in a range from 10 nm to 500 µm, more preferably in a range from 25 nm to 400 µm, very preferably in a range from 50 nm to 250 µm, more particularly in a range from 100 nm to 100 µm, and preferably a structure height in a range from 10 nm to 500 µm, more preferably in a range from 25 nm to 400 µm, very preferably in a range from 50 nm to 300 µm, more particularly in a range from 100 nm to 200 µm.

Embodiment 7: The method according to any of embodiments 1 to 6, wherein at least one adhesive is applied to the surface of the substrate (S2) not to be contacted with coating composition (C2a).

Embodiment 8: The method according to any of embodiments 1 to 7, wherein in step (5-i) the composite (C2S2) is obtained by peeling from the composite (S1C1C2S2) with additional restoration of the composite (S1C1) provided in step (1), or vice versa.

Embodiment 9: The method according to any of embodiments 1 to 7, wherein the at least partially embossed and at least partially cured coating (C2) in step (5-ii) is obtained as a free film by peeling from the composite (S1C1C2) with additional restoration of the composite (S1C1) provided in step (1), or vice versa.

Embodiment 10: The method according to any of embodiments 1 to 7, wherein the removal from the composite (S1C1) comprises the following steps:
- 5-i-a) applying at least one adhesive layer (AL) on the surface of the substrate (S2) not being in contact with the at least partially embossed coating (C2) providing a composite (S1C1C2S2AL);
- 5-i-b) optionally, at least partially attaching the composite (S1C1C2S2AL) to an object (O1);
- 5-i-c) removing, preferably peeling, composite (S1C1) from the composite (C2S2AL) optionally at least partially attached to an object (O1), or vice versa.

Embodiment 11: The method according to any of embodiments 1 to 7, wherein the removal from the composite (S1C1) comprises the following steps:
- 5-ii-a) applying at least one adhesive layer (AL) on at least a part of the unstructured surface of the at least partially embossed coating (C2) providing a composite (S1C1C2AL);
- 5-ii-b) optionally, at least partially attaching the composite (S1C1C2AL) to an object (O1);
- 5-ii-c) removing, preferably peeling, composite (S1C1) from the composite (C2S2AL) optionally at least partially attached to an object (O1), or vice versa.

Embodiment 12: The method according to any of embodiments 1 to 11, wherein the composite (S1C1) provided in step (1) is used as embossing mold (e2) of an embossing tool (E2) to transfer the embossed structure of the coating (C1) as embossed structure to the coating composition (C2a) in step (2-i), and in steps (2-ii) and (3-ii),
where the mirror image of the structured surface of the coating (C1) of composite (S1C1) used as embossing mold (e2) is embossed into the surface of the at least partially embossed and at least partially cured coating (C2) optionally applied on a substrate (S2).

Embodiment 13: The method according to any of embodiments 1 to 12, wherein the substrate (S1) is a film web, preferably a moving film web or continuous film web, more preferably a continuous moving film web.

Embodiment 14: The method according to any of embodiments 1 to 13, wherein the substrate (S2) is a film web, preferably a moving film web, more preferably a continuous moving film web.

Embodiment 15: The method according to any of embodiments 1 to 14, wherein the composite (S1C1) that is used in step (2-i) and steps (2-ii) and (3-ii) is reusable and can be used repeatedly for transferring at least one embossed structure when step (5-i) or (5-ii) of the method is carried out.

Embodiment 16: The method according to any of embodiments 1 to 15, wherein during the implementation of step (3-i), the composite (S1C1) in step (3-i) is guided via a first roll functioning as embossing tool (E2) and composite (S2C2a) is guided via a second roll, which lies opposite the first roll and is counter-rotatory thereto or co-rotatory therewith,
and
during the implementation of step (3-ii), the composite (S1C1C2a) in step (3-ii) is guided via a first roll functioning as embossing tool (E2), and the substrate (S2) used within step (3-ii) is guided via a second roll, which lies opposite to the first roll and is counter-rotatory thereto or co-rotatory therewith.

Embodiment 17: The method according to embodiment 16, wherein the at least partial embossing of step (3-i) takes place at the level of the roll nip which is formed by the two mutually opposing rolls, where the rolls are counter-rotatory or co-rotatory, where the at least partially embossed coating (C1) of the composite (S1C1) is facing the coating composition (C2a) of the composite (S2C2a), and
the at least partial embossing of step (3-ii) takes place at the level of the roll nip which is formed by the two mutually opposing rolls, where the rolls are counter-rotatory or co-rotatory, where the coating composition (C2a) of the composite (S1C1C2a) is facing the substrate (S2).

Embodiment 18: The method according to any of embodiments 1 to 17, wherein the composite (S1C1) provided in step (1) is at least obtainable by
(6) applying the radiation-curable coating composition (C1a) to at least a part of the surface of a substrate (S1) to provide a composite (S1C1a);
(7) at least partially embossing the coating composition (C1a) applied at least partly to the surface of the substrate (S1) by means of at least one embossing tool (E1) comprising at least one embossing mold (e1);
(8) at least partially curing the at least partially embossed coating composition (C1a) applied at least partially to a substrate (S1) which throughout the duration of the at least partial curing is in contact with the at least one embossing mold (e1) of the embossing tool (E1);
(9) removing the composite (S1C1) from the embossing mold (e1) of the embossing tool (E1) to provide the at least partially embossed and at least partially cured composite (S1C1), or vice versa.

Embodiment 19: The method according to embodiment 18, wherein the at least one coating composition (C1a) in step (6) is applied in a dry layer thickness of at least 0.5 μm, preferably at least 1 μm, more preferably at least 5 μm.

Embodiment 20: The method according to any of embodiments 1 to 19, wherein the coating composition (C1a) comprises a total amount of 5 to 45 weight %, preferably 8 to 40 weight %, more preferably 9 to 35 weight %, based on the total weight of the coating composition (C1a), of at least one crosslinkable polymer and/or oligomer.

Embodiment 21: The method according to any of embodiments 1 to 20, wherein the coating composition (C1a) comprises a total amount of at least 25 weight %, preferably at least 50 weight %, more preferably at least 90 weight %, very preferably 100 weight %, based on the total weight off all crosslinkable polymer and/or oligomer comprised in the coating composition (C1a), of at least one silicone (meth) acrylate oligomer, preferably exactly one silicone (meth) acrylate oligomer, more preferably exactly one silicone (meth)acrylate oligomer comprising on average 2 to 3 unsaturated groups.

Embodiment 22: The method according to any of embodiments 1 to 21, wherein the coating composition (C1a) comprises a total amount of 5 to 45 weight %, preferably 8 to 40 weight %, more preferably 9 to 35 weight %, based on the total weight of the coating composition (C1a), of at least one crosslinkable polymer and/or oligomer selected from a group consisting of i) at least one silicone (meth)acrylate oligomer, preferably exactly one silicone (meth)acrylate oligomer, very preferably exactly one silicone (meth)acrylate oligomer comprising on average 2 to 3 unsaturated groups and ii) other crosslinkable polymer and/or oligomer selected from (meth)acrylated oligomer or polymer compounds, urethane (meth)acrylates, vinyl (meth)acrylates, epoxy (meth)acrylates, polyester (meth)acrylates, poly (meth)acrylates, polyether (meth)acrylates, olefin (meth) acrylates, (meth)acrylated oils, and mixtures thereof, preferably urethane (meth)acrylate oligomer.

Embodiment 23: The method according to any of embodiments 1 to 22, wherein the coating composition (C1a) comprises as reactive diluent free-radically polymerizable monomers, preferably ethylenically-unsaturated monomers, more preferably multifunctional ethylenically unsaturated monomers.

Embodiment 24: The method according to any of embodiments 1 to 23, wherein the coating composition (C1a) comprises at least one reactive diluent selected from hexane diol diacrylate and compounds comprising at least two, preferably at least 3, more preferably 3, structural units which may be different from each other or at least partially identical, of the general formula (I)

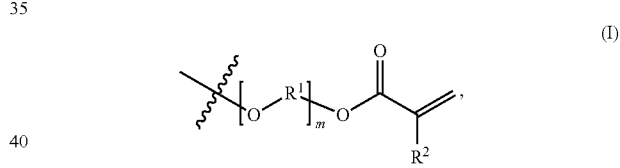

wherein
the radicals $R^1$, independently of each other, are $C_2$-$C_8$ alkylene groups, very preferably $C_2$ alkylene groups,
the radicals $R^2$, independently of each other, are H or methyl, and
the parameters m, independently of each other, are an integral number in a range from 1 to 15, very preferably from 1 to 4 or 2 to 4, but with the proviso that in at least one of the structural units of the formula (I) the parameter m is at least 2, preferably exactly 2.

Embodiment 25: The method according to embodiment 24, wherein said compound comprises three identical structural units of the formula (I) and the parameter m is at least 2, preferably exactly 2.

Embodiment 26: The method according to any of embodiment 24 or 25, wherein the compound of the at least one reactive diluent comprises at least two structural units of the general formula (I) selected from (meth)acrylates of neopentyl glycol, trimethylolpropane, trimethylolethane or pentaerythritol, with a total of 4-fold to 20-fold or of 4-fold to 12-fold alkoxylation, preferably ethoxylated, propoxylated or ethoxylated and propoxylated, very preferably ethoxylated, neopentyl glycol, trimethylolpropane, trimethylolethane or pentaerythritol, most preferred (meth)acrylates derived from alkoxylated trimethylolpropane.

Embodiment 27: The method according to any of embodiments 1 to 6, wherein the coating composition (C1a) comprises a total amount of 40 to 95 weight %, preferably 50 to 85 weight %, more preferably 55 to 83 weight %, based on the total weight of the coating composition (C1a), of the at least one reactive diluent, preferably of hexane diol diacrylate and/or (meth)acrylates derived from 6-fold ethoxylated trimethylolpropane.

Embodiment 28: The method according to any of embodiments 1 to 27, wherein the coating composition (C1a) comprises the at least one photoinitiator in a total amount of 0.01 to 15 weight %, preferably 0.5 to 10 weight %, more preferably 1 to 8 weight %, based on the total weight of the coating composition (C1a).

Embodiment 29: The method according to any of embodiments 1 to 28, wherein the photoinitiator comprised in the coating composition (C1a) is selected from phosphine oxides including (alkyl-)benzoylphenylphosphine oxides, benzophenones, α-hydroxyalkyl aryl ketones, thioxanthones, anthraquinones, acetophenones, benzoins and benzoin ethers, ketals, imidazoles or phenylglyoxylic acids and mixtures thereof, preferably diphenyl(2,4,6-trimethylbenzoyl) phosphine oxide, ethyl (2,4,6-trimethylbenzoyl)phenylphosphinate, phenylbis(2,4,6-trimethylbenzoyl)-phosphine oxide, benzophenone, 1-benzoylcyclohexan-1-ol, 2-hydroxy-2,2-dimethylacetophenone and 2,2-dimethoxy-2-phenylacetophenone and mixtures thereof.

Embodiment 30: The method according to any of embodiments 1 to 29, wherein the coating composition (C1a) comprises the at least one additive in a total amount of 0.01 to 5 weight %, preferably 0.2 or 0.5 to 5 weight %, more preferably 0.5 to 3 weight %, based on the total weight of the coating composition (C1a), of at least one additive.

Embodiment 31: The method according to any of embodiments 1 to 30, wherein the coating composition (C1a) comprises a total amount of less than 10 weight %, preferably less than 5 weight %, more preferably less than 1 weight %, very preferably no organic solvents, based on the total weight of the coating composition (C1a).

Embodiment 32: The method according to any of embodiments 1 to 30, wherein the coating composition (C1a) is comprised in a total amount of 90 to 100 weight %, preferably 95 to 100 weight %, more preferably 99 to 100 weight % of components (a), (b), (c), and optional (d), based on the total weight of the coating composition (C1a).

Embodiment 33: A composite (S1C1) composed of a substrate (S1) and an at least partially embossed and at least partially cured coating (C1), wherein the coating (C1) is obtainable by at least partially curing a coating composition (C1a) applied to at least a part of a surface of the substrate (S1) and at least partially embossing, by radiation curing, wherein the coating composition (C1a) is a radiation-curable coating composition, comprising
(a) 5 to 45 weight % of at least one crosslinkable polymer and/or oligomer,
(b) 40 to 95 weight % of at least one reactive diluent,
(c) 0.01 to 15 weight % of at least one photoinitiator, and
(d) 0 to 5 weight % of at least one additive;
where (i) the stated total amounts of the components (a), (b), (c), and (d) are each based on the total weight of the coating composition (C1a), and (ii) the total amounts of all components present in the coating composition (C1a) add up to 100 weight %;
wherein the at least one crosslinkable polymer and/or oligomer (a) comprises a total amount of at least 25 weight %, preferably at least 50 weight %, more preferably at least 90 weight %, very preferably 100 weight %, based on the total weight of all crosslinkable polymer and/or oligomer comprised in the coating composition (C1a), of at least one silicone (meth)acrylate oligomer.

Embodiment 34: The composite (S1C1) according to embodiment 33, wherein the composite (S1C1) is obtainable by implementation of the method steps (6) to (9) described in embodiment 18 or 19.

Embodiment 35: The composite (S1C1) according to embodiment 33 or 34, wherein the substrate (S1) is a film web, preferably a moving film web, more preferably a continuous moving film web.

Embodiment 36: Use of the composite (S1C1) according to any of embodiments 33 to 35 as embossing mold (e2) of an embossing tool (E2) for transferring an embossed structure to at least a part of a surface of a coating composition (C2a), or to at least a part of a surface of a coating composition (C2a) which is at least partly applied on a substrate (S2).

Embodiment 37: The method according to any of embodiments 1 to 5, wherein the radiation-curable coating composition (C1a) comprises 50 to 95 weight %, or 50 to 85 weight %, or 50 to 83 weight %, of at least one reactive diluent, based on the total weight of the coating composition (C1a).

Embodiment 38: The composite according to any of embodiments 33 to 36, wherein the radiation-curable coating composition (C1a) comprises 50 to 95 weight %, or 50 to 85 weight %, or 50 to 83 weight %, of at least one reactive diluent, based on the total weight of the coating composition (C1a).

Methods of Determination

1. Determining Mold Filling

Mold filling is determined by means of a commercial scanning electron microscope (SEM). By means of SEM it is possible accordingly to compare, for example, the surface topography of a defined lattice structure of different master films (S1C1) after embossing, having for example features from 10 nm to 1000 μm structure width and in a range from 1 nm to 1000 μm structure depth. Mold filling is considered complete if sharp features such as the tip of triangular shaped structure is completely replicated. Next to comparing the surface topography of the different master films (S1C1), mold filling can as well be compared 2. Determining the Flow Time The flow time is determined in accordance with DIN EN ISO 2431 (date: March 2012). The method involves determining the flow time by means of a 4 mm flow cup (No. 4), 5 mm flow cup (No 5), or 6 mm flow cup (No 6) at room temperature (20° C.).

Flow times in the range from 40 or 50 to 100 s measured in a 4 mm flow cup, 30 to 100 s measured in a 5 mm flow cup, and 30 to 200 s, preferably 30 to 150 s, more preferably 30 to 115 s, measured in a 6 mm flow cup, are considered acceptable.

Hence, coating compositions with flow times >200 s in a 6 mm flow cup are considered not favorable, as the coating compositions would not spread sufficiently fast in a homogeneous layer thickness over the entire width of the substrate or composite decreasing the quality of mold filling and replication, and the risk of air entrapment in the applied coating composition increases with increasing flow times.

On the other hand, flow times <40 or 50 s in a 4 mm flow cup are considered disadvantageous as the coating compositions would simply run of the substrate when applied for instance in a roll-to-roll (R2R) embossing apparatus, thereby not providing a sufficient cohesion within the layer allowing a layer thickness sufficient for embossing microstructures and nanostructures with a sufficient mold filling and transfer quality.

3. Determining the Adhesion 3.1 Cross Hatch Test

The adhesion is determined in accordance with DIN EN ISO 2409 (date: June 2013) by means of the cross hatch test. In this test, in a duplicate determination, the adhesion of the coating layer under investigation to the substrate is examined. A cross hatch tester from Byk Gardner with a 2 mm cut spacing is used manually. Subsequently, Tesa tape No. 4651 is pressed onto the damaged area and peeled off to remove the delaminated regions. The assessment is made on the basis of characteristic values ranging from 0 (minimal delamination) to 5 (very high delamination). An average value of less than or equal to 3.5 is classed as sufficient.

3.2 St. Andrew's Cross

The adhesion is determined by means of a proprietary cross-cut test. In this test, a St. Andrew's cross (length: 10 cm, angle: 45°) is manually cut into the coating layer by means of a scalpel. Subsequently, Tesa tape No. 4651 is pressed onto the damaged area and peeled off to remove the delaminated regions. If the coating layer shows no visible delamination after cutting and/or peeling off the tape, the adhesion of the coating layer is rated "OK". If the coating layer shows visible delamination after cutting and/or after peeling off the tape, the adhesion of the coating layer is rated "Not OK 4. Determining the Success of Replication The success of replication is determined visually, with the percentage fraction of successfully replicated area being ascertained. The range here lies between 0% to 100% of successfully replicated area. If less than 100% of the area is replicated, this means that a corresponding fraction of the area could not be removed from the embossing mold, in other words that the coating C1 in the form of S1C1 remained partially adhering to the embossing mold (e1) of the embossing tool (E1), or that the coating C2 remained partially adhering to the composite (S1C1) after separation.

5. Determining the Layer Thickness Distribution

The layer thickness distribution is determined by measuring the layer thickness of the composite S1C1 including imprinted structures. In other words, the determined total thickness of the layer stack S1C1 is the sum of the individual heights of substrate S1, residual layer of coating C1, and the structures formed in or on coating C1. The thickness was determined in accordance with DIN EN ISO 2808 (date: May 2007), procedure 12A by means of an ElektroPhysik MiniTest® 2100 microprocessor coating thickness gauge in combination with a F1.6 probe (measuring uncertainty: ±(1%+1 µm)). In the absence of a ferromagnetic substrate, the measurement was conducted by placing the composite S1C1 on an even ferromagnetic plate. On a 15 cm×15 cm patch of S1C1, the layer thickness is determined on 9 predefined points, arranged in a 3×3 matrix. All measurement points are 5 cm-spaced from each other, with the first point or starting point of measurement at 2.5 cm from the top and 2.5 cm from the left side of the 15 cm×15 cm patch of S1C1. Hence, the second point of measurement is positioned 2.5 cm from the top and 7.5 cm from the left side of the 15 cm×15 cm patch of S1C1.

6. Determination of Flexibility

The flexibility of the respective composite (S1C1) was determined by folding it 180°. If no visual cracks and/or damages within the coating (C1) were observed during and/or after folding, the rating is "OK". If visual cracks and/or damages within the coating (C1) were observed during and/or after folding, the rating is "not OK".

INVENTIVE AND COMPARATIVE EXAMPLES

The inventive and comparative examples below serve to illustrate the invention, but should not be interpreted as imposing any restriction.

Unless otherwise indicated, the amounts in parts are parts by weight and amounts in percent are in each case percentages by weight.

1. Ingredients and Materials Used

Hostaphan® GN CTO1B—commercially available PET film, two side chemically treated for improvement of the adhesion of coatings, with a layer thickness of 175 µm. A commercially available PET film, double-sided urethane coated for enhanced adhesion to inks and coatings especially to UV curing inks, with a layer thickness of 125 µm, provided by SKC, South Korea.

Laromer® UA 9033 (L UA 9033)—aliphatic urethane acrylate from BASF SE

Laromer® UA 9089 (L UA 9089)—aliphatic urethane acrylate from BASF SE Hexanediol diacrylate (HDDA)

Hydroxypropylacrylat (HPA)

Sartomer® CN9800 (CN9800)—aliphatic silicone acrylate from Sartomer

Sartomer® 499 (SR 499)—TMPTA (trimethylolpropane triacrylate) with 6-fold ethoxylation, from Sartomer Sartomer® SR 344 (Arkema Inc.)—polyethylene glycol (400) diacrylate Irgacure® 184 (1-184)—commercially available photoinitiator from BASF SE, Irgacure® TPO-L (I-TPO-L)—commercially available photoinitiator from BASF SE, Tego® Rad 2500 (TR 2500)—lubricity and antiblocking additive from Evonik (silicone acrylate), 2. Examples 2.1 Production of Coating Compositions (C1a) According to the Invention (C1a-1) and Corresponding Comparative Coating Composition (C1a-2)

Coating compositions suitable as coating composition (C1a) for the production of composites (S1C1) were produced in accordance with Table 1 below. The flow times ascertained at room temperature (20° C.) are in the range from 26 to 172 s in the case of the production of C1a-5 and C1a-9.

TABLE 1

| Coating compositions (C1a) | | | | | | | | | | | |
|---|---|---|---|---|---|---|---|---|---|---|---|
| | Coating composition | | | | | | | | | | |
| | C1a-1 | C1a-2* | C1a-3* | C1a-4* | C1a-5* | C1a-6* | C1a-7* | C1a-8* | C1a-9 | C1a-10 | C1a-11 |
| CN9800 | 56.8 | 51.8 | 46.8 | 41.8 | 30 | 31 | 21.8 | 11.8 | — | 40 | 40 |
| Laromer UA 9033 | | | | | | | | | 13.8 | | |
| Laromer UA9089 | | | | | | | | | | 30.0 | 30.0 |
| HDDA | 5.66 | 6.47 | 7.28 | 8.09 | 10.0 | 10.0 | 11.33 | 12.94 | 13.8 | 5.0 | |
| SR 499 | 29.34 | 33.53 | 37.72 | 41.91 | 51.8 | 51.8 | 58.67 | 67.06 | 64.2 | 20.0 | |
| SR 344 | | | | | | | | | | | 20 |
| HPA | | | | | | | | | | | 5 |
| TR 2500 | 1 | 1 | 1 | 1 | 1 | | 1 | 1 | 1 | | |

TABLE 1-continued

Coating compositions (C1a)

| | C1a-1 | C1a-2* | C1a-3* | C1a-4* | C1a-5* | C1a-6* | C1a-7* | C1a-8* | C1a-9 | C1a-10 | C1a-11 |
|---|---|---|---|---|---|---|---|---|---|---|---|
| I-TPO-L | 3.6 | 3.6 | 3.6 | 3.6 | 3.6 | 3.6 | 3.6 | 3.6 | 3.6 | 2.5 | 2.5 |
| I-184 | 3.6 | 3.6 | 3.6 | 3.6 | 3.6 | 3.6 | 3.6 | 3.6 | 3.6 | 2.5 | 2.5 |
| % Reactive diluent | 35 | 40 | 45 | 50 | 61.8 | 61.8 | 70 | 80 | 78 | 25 | 25 |
| Flow time [s] | 279 | 194 | 120 | 110 | 46 | 44 | 55 | 77 | 90 | 529 | 437 |
| (flow cup size in mm) | (6) | (6) | (6) | (6) | (6) | (6) | (5) | (4) | (4) | (6) | (6) |

*Inventive examples

Flow times, determined by the method as described above under point 2. (Determining the flow time), of inventive examples C1a-2 to C1a-8 having a total amount of reactive diluent from 40 to 80 weight %, based on the total weight of coating composition (C1a), are in the acceptable range from 20 to 50 s measured in a 4 mm flow cup to 200 s measured in a 6 mm flow cup. Flow times of comparative examples C1a-1 (total amount of reactive diluent 35 weight %), C1a 10 (total amount of reactive diluent 25 weight %) and C1a-11 (total amount of reactive diluent 25 weight %, composition aligned to KR 2009/0068490 A, example 1) are disadvantageously high and therefore not acceptable.

2.2 Production of Composites (S1C1) Using a Coating Composition According to the Invention (C1a-5) and a Comparative Coating Composition (C1a-9)

A number of different composites (S1C1) in accordance with table 2 below are produced using a roll-to-plate (R2P) embossing apparatus with an embossing mold (e1) made of nickel bearing the desired image of the to be embossed structure. The image of the structures in the embossing mold (e1) corresponds thereby with the image of the structures to be embossed into coating composition (C2a) in a subsequent step.

In these examples, embossing molds (e1) made of nickel with different positive structures were used, specifically with:

a microstructure M1 (three-dimensional triangular structure with a height of 61 μm and a periodic repetition of 130 μm, or with a microstructure M2 (two-dimensional triangular structure with a height of 42 μm and 55 μm space between the structures, For this purpose, one each of the above-described coating compositions C1a-5 and C1a-9 is applied to the embossing mold (e1) of embossing tool (E1), and a PET film as substrate (S1) is applied to it. The resulting stack of film and respective coating composition then runs through beneath a pressing roll and, still while the embossing apparatus is in contact with the coating composition of the respective stack, the coating compositions are at least partially cured by means of a UV-LED lamp. The at least partially cured coating together with the film, with the negative structure by comparison with embossing mold (e1), is subsequently separated from the embossing apparatus, to give the structured film (master film) as composite (S1C1). The master films are subsequently post-exposed with a UVA lamp. The symbol "-" within the table denotes that the particular post-cure was not carried out.

TABLE 2

Production parameters

| | Master film | | | | | |
|---|---|---|---|---|---|---|
| | A | B | C | D | E | F |
| Coating composition (C1a) | C1a-5 | C1a-9 | C1a-5 | C1a-9 | C1a-5 | C1a-9 |
| Substrate (S1); a PET film | Hostaphan ® GN CT01B | Hostaphan ® GN CT01B | SKC foil | SKC foil | SKC foil | SKC foil |
| Embossing mold (e1) | Structure M1 | Structure M1 | Structure M2 | Structure M2 | Structure M2 | Structure M2 |
| 365 nm UV-LED lamp | 6 W, Easytec (100% lamp power, 2 m/min, 2 passes). | 6 W from Easytec (100% lamp power, 2 m/min, 2 passes). | 10 W Heraeus Semray (100% lamp power, 5 m/min, 2 passes). | 10 W Heraeus Semray (100% lamp power, 5 m/min, 2 passes). | 10 W Heraeus Semray (100% lamp power, 8 m/min, 2 passes). | 10 W Heraeus Semray (100% lamp power, 8 m/min, 2 passes). |
| UVA lamp for post exposure | Panacol-Elosal UV F-900 | Panacol-Elosal UV F-900 | — | — | — | — |

The master films A and B with microstructure M1 are used for determining the mold filling quality, the adhesion, and the success of replication—see Section 2.3.1—and also used for the production of transfer films and investigations thereto as described below under points 2.4 to 2.5.2. The master films C, D, E, and F with the microstructure M2 are used for determining the layer thickness homogeneity as described in Section 2.3.2 below. For producing these master films, the coating compositions (C1a-5) and (C1a-9) are used and correspondingly composites (S1C1), wherein the coating (C1) is a coating (C1-5) or (C1-9) derived from coating compositions (C1a-5) or (C1a-9), respectively, having as embossed structure the microstructure M1 or M2, are obtained.

In another series of experiments, composites (S1C1) were prepared according the production parameters of "Master film C" as shown in Table 2, wherein coating composition (C1a-5) was replaced respectively by one of coating compositions (C1a-1) to (C1a-8), (C1a-10) or (C1a-11) as shown in Table 1, providing master films G to P.

Master films G to P, prepared from coating compositions (C1a-1) to (C1a-8), (C1a-10) or (C1a-11), all showed acceptable layer thicknesses in the range of 203 to 225 µm. The flexibility of Master films G to 0, determined 7 days after production according the method described under point 6. above, was "OK". Only the flexibility of master film P, prepared from comparative coating composition (C1a-11), was "not OK". Furthermore, observation of master films G to P with an Olympus SZX12 stereo microscope revealed an inacceptable amount of air entrapment in case of master film P, prepared from comparative coating composition (C1a-11).

2.3 Investigations on Master Films (S1C1)

2.3.1 Determination of Adhesion and Mold Filling.

Table 3 below summarizes the investigations conducted on master films A and B. The investigations were each conducted in accordance with the methods described above.

TABLE 3

| Master film | Adhesion (Cross hatch test) | Adhesion (St. Andrew's cross) | Success of replication (%) |
| --- | --- | --- | --- |
| A | 3.5 | OK | 100 |
| B | 5 | Not OK | 100 |

The data in Table 3 shows good adhesion for inventive master film A (cross hatch test and St. Andrew's cross test), compared to an inadequate adhesion achieved with comparative master film B (cross hatch test evaluated with a rating of 5, St. Andrew's cross test negative). If adhesion of the master coating (C1) on the substrate (S1), in these examples adhesion of coating compositions (C1-5) and (C1-9) on PET film, is insufficient, problems may occur during embossing both of the coating composition (C1a) and also, later on, when using the master film as embossing mold (e2), of the coating composition (C2a).

The success of replication of master film A remained as good as the success of replication of master film B (Table 3, success of replication). Hence, also with the inventively employable coating composition, no residues remained on the embossing mold (e1).

Figure 3:
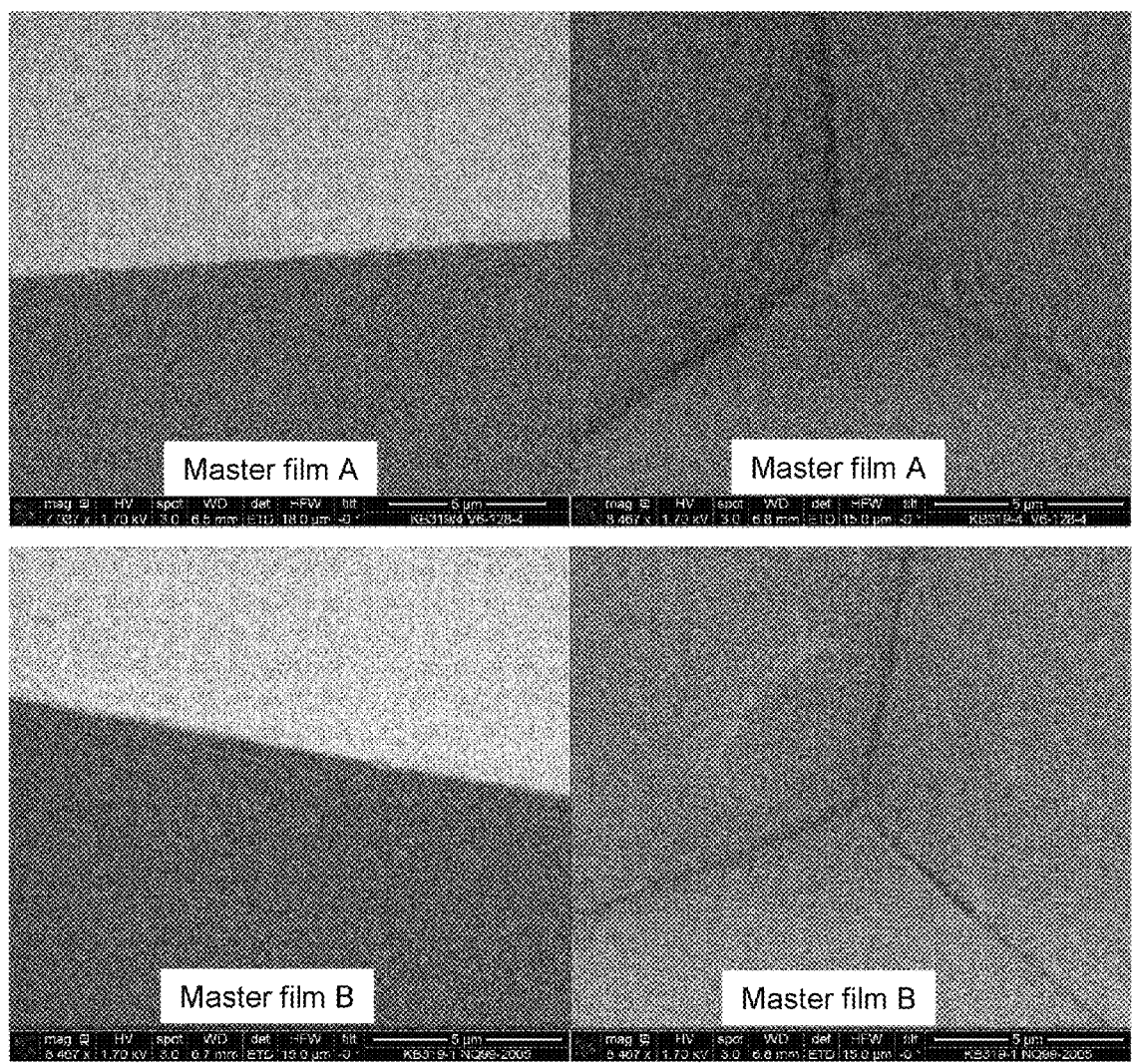

Mold filling of master films A and B was determined as described above by visual inspection and comparing of SEM images of the triangular features embossed into the coating compositions (C1a) applied to substrates (S1) by the embossing mold (e1) of the embossing tool (E1) (FIG. 3). Comparison of the SEM images of master films A and B shows a complete and comparable transfer of the structures from the embossing mold to the coating composition (C1a) including sharp details such as edges and triangular features. Hence, introducing large amounts of silicone (meth)acrylate oligomers to the coating composition of (C1a) according the invention did not result in any loss of mold filling quality, as might have been expected due to different surface tensions of the coating compositions (C1a-5) and (C1a-9). Hence, a complete and comparable filling of the negative features in the mold for both coating compositions C1a-1 and C1a-2 was observed.

In summary it can be stated that only master film A furnishes good results in respect of all properties investigated (adhesion, mold filling, and success of replication).

2.3.2 Determination of Layer Thickness Homogeneity

Table 4 below summarizes the investigations conducted on master films C, D, E, and F. The investigations were each conducted in accordance with the methods described above. The pressure applied (3.3 bar) and slot size (3.28 mm) of the coater to apply the coating composition were identical for this series of experiments.

TABLE 4

| | Master film | | | |
| --- | --- | --- | --- | --- |
| | C | D | E | F |
| Coating composition (C1a) | C1a-5 | C1a-9 | C1a-5 | C1a-9 |
| Processing speed [m/min] | 5 | 5 | 8 | 8 |
| Delta minimum to maximum layer thickness (S1C1) [µm] | 29 | 55 | 37 | 57 |
| Average layer thickness (S1C1) [µm] | 203 | 179 | 208 | 184 |
| Standard deviation [µm] | 9 | 19 | 11 | 19 |
| Standard deviation [%] | 4.5 | 10.4 | 5.2 | 10.1 |

The data in Table 4 shows a strong decrease between the maximum difference in layer thickness (Delta minimum to maximum layer thickness (S1C1)) determined for inventively employed master films C and E compared to comparative master films D and F, for two processing speeds, which is also reflected by much smaller standard deviations. Furthermore, the layer thickness of the applied coating compositions was not only far more homogeneous, but the average layer thickness itself could be increased as well.

If the layer thickness of the master coating (C1a) is too inhomogeneous over the width of the substrate (S1), problems may occur during embossing both of the coating composition (C1a) and also, later on, of the coating composition (C2a). The quality of replication of the image of the structures from the embossing mold (e1) of embossing tool (E1), especially on larger dimensions, generally improves with the homogeneity of the layer thickness of the coating composition (C1a), as the pressure applied to impress the positive features of the embossing mold (e1) of embossing tool (E1) into the coating composition (C1a) is evenly distributed, allowing equal impression over the entire width of the embossing tool. A homogeneous layer thickness of the coating composition (C1a) will therefore result in a higher replication quality of the features of embossing mold (e1) in the coating (C1) having a homogeneous residual layer over the entire or near entire width of the film. As a result, when employing the composite (S1C1) as embossing mold itself, such as an embossing mold (e2), a homogeneous layer thickness of the coating (C1) will allow improved transfer of embossed structures to the coating composition (C2a), as also here the pressure applied to the composite (S1C1) is more equally distributed over the entire composite (S1C1), allowing a higher quality of replication and more reproducible transfer of embossed structures in coating composition (C2a).

In summary, it can be stated that the homogeneity of the layer thickness of master films C and E was strongly improved compared to master films D and F.

2.4 Production of Transfer Films (S1C1C2):

The master films (S1C1) obtained respectively with the structure M1 are then each used in a roll-to-plate (R2P) embossing apparatus, and a coating composition (C2a) is applied with a dry layer thickness of 40 µm to the structured surface of the respective master film. The resulting stack of master film and coating composition (C2a) is lined temporarily with a TAC film to protect the coating composition (C2a) against oxygen and mechanical influences. The stack obtained in turn, comprising master film (S1C1), coating composition (C2a) applied thereto, and TAC film applied to the coating composition (C2a), then runs through beneath a pressing roll (pressure applied 6 bar), in a process simultaneous with the at least partial curing of the coating composition (C2a) by a UV-LED lamp. The lamp used in this case is a 365 nm, 6 W UV-LED lamp from Easytec (100% lamp power, 2 m/min, 2 passes). In this way, following removal of the protecting TAC film, a composite (S1C1C2-1) is obtained from master film A and a composite (S1C1C2-2) is obtained from master film B.

The coating composition (C2a) employed is a commercial, radiation-curing coating composition which comprises at least one urethane acrylate, at least one photoinitiator and also commercial additives.

2.5 Investigations on Composites (S1C1C2)

2.5.1 Separation Behavior i) as Function of Time Between Producing Composite (S1C1) and Applying Coating Composition (C2a) and as Function of Time Between Applying Coating Composition (C2a) to Composite (S1C1) and Separating.

Table 5 below summarizes the result of the investigations on separation behavior between structured master film (S1C1) and resultant coating (C2) as function of the age of the master film (S1C1) expressed by the replication quality, taking account of the particular master film (S1C1) used for embossing. Coating (C2) is removed from composite (S1C1) by peeling. The symbol "-" within the table denotes that the particular investigation was not carried out.

master film, application after a few days or even application of coating composition (C2a) and storing it together with the master film (S1C1) before separating coating (C2) from master film (S1C1), allowing protection of the imprinted structures of the composite (S1C1), clean release from the composite (S1C1) without residues, thereby improving the re-usability of the composite (S1C1) as embossing mold, and obtaining an embossed coating (C2) as freestanding film. Similar accounts for 9-day old master films G to 0, prepared from coating compositions (C1a-1) to (C1a-8), and (C1a-10), showing a 100% separation behavior of coating (C2) directly and 1 day after curing.

2.5.2 Mold Filling

Figure 4:
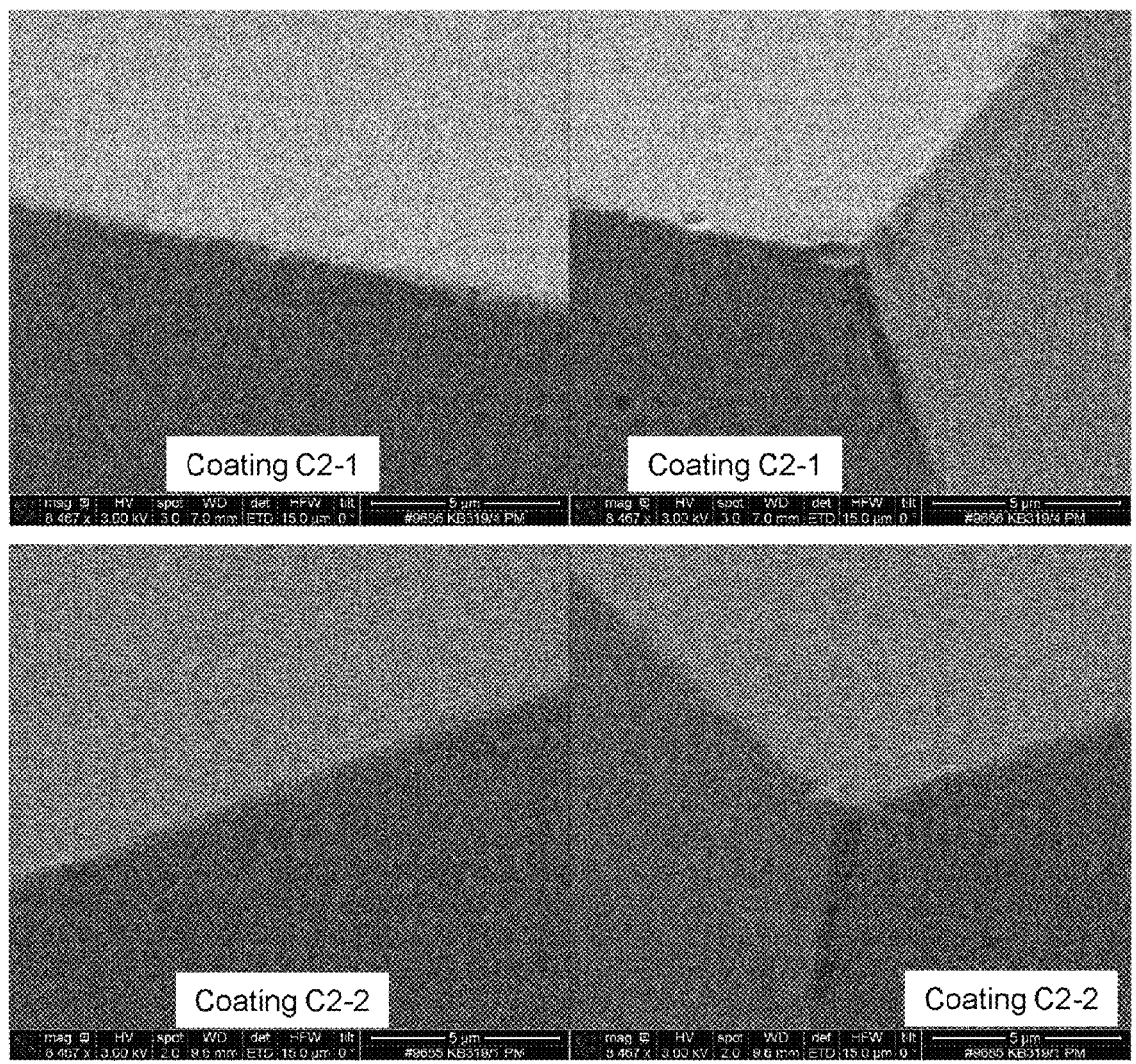

The quality of mold filling of coating composition (C2a) into the master films A and B employable as embossing mold was determined as described above by visual inspection and comparing of SEM images of the triangular features transferred into coating composition (C2a) by embossing, whereby the identical coating composition (C2a) was applied 11 days after producing the master foil A or B, respectively, and separation was performed directly after curing (FIG. 4). Comparison of the SEM images of the embossed and cured coatings (C2) after separation from the master film A and B shows also here a complete and comparable transfer of the structures from the master films A and B to the coating composition (C2a) including sharp details such as edges and triangular features. In FIG. 4, the

TABLE 5

Separation behavior coating composition (C2) from master film (S1C1)

| | Master film used | | | | | | | |
|---|---|---|---|---|---|---|---|---|
| | A | B | A | B | A | B | G - O | P |
| Time before application coating composition (C2a) to freshly produced master film (S1C1) Success of replication upon separation of (C2) from (S1C1) | <5 min | <5 min | 5 days | 5 days | 11 days | 11 days | 9 days | 9 days |
| directly after curing | 100% | 10% | 100% | 0% | 100% | 98% | 100% | 0% |
| 1 day after curing | 97% | 50% | — | — | — | — | 100% | 0% |
| 7 days after curing | — | — | — | — | 100% | 60% | — | — |

When using master film B, the success of replication upon separating master film (S1C1) and coating (C2) is far below <100%, even 0% if the coating composition (C2a) is applied 5 days after producing the master film (S1C1) from coating composition (C1a-9) and direct separation after curing. Hence, large parts of the coating (C2) could not be separated or removed from the coating (C1) of the respective master films B without destruction of the coating (C2) or master film B. Master film "P", prepared from comparative coating composition (C1a-11) as described below Table 2, remained tacky after curing, resulting in these master films sticking to each other upon storage and a poor separation behavior of 0% from coating (C2) directly and 1 day after curing. In contrast thereto, when using the investigated master film A, a success of replication upon separation of 100% or nearly 100% (97%) is achieved, independent from the time passed between preparing master film and applying the coating composition (C2a) or time passed after embossing and curing the coating composition (C2a) applied to the master film (S1C1). In other words, use of master film A provides for a very high success of replication (as indicator for the separation behavior) independent from aging of the master film itself, allowing even to store or transport the layer stack (S1C1C2) composed of master film (S1C1) and coating (C2). Hence, master film A allows, compared to master film B, direct application of coating composition (C2a) to the coating (C2) derived after separation from master film A according the invention is denoted as coating C2-1. Correspondingly, the coating (C2) derived after separation from master film B is denoted as coating C2-2. Hence, introducing large amounts of silicone (meth)acrylate oligomers to the coating composition of (C1a) according the invention did not result in any loss of mold filling quality or decrease of mold filling, as might have been expected due to different surface energies of the coating compositions (C1-5) and (C1-9) compared to the surface tension of coating composition (C2a). Hence, a complete and comparable transfer of the positive features of the master films A and B comprising coating compositions (C1a-5) and (C1a-9) was observed.

What is claimed is:

1. A method for transferring an embossed structure to at least a part of a surface of a coating composition (C2a) using a composite (S1C1), said method comprising at least the steps (1), (2-i) and (3-i) or (2-ii) and (3-ii), and also at least step (4) and optionally step (5-i) or (5-ii)

(1) providing a composite (S1C1) composed of a substrate (S1) and an at least partially embossed and at least partially cured coating (C1);
and
(2-i) applying at least one coating composition (C2a) to at least a part of a surface of a substrate (S2) to provide composite (S2C2a);

(3-i) at least partially embossing the coating composition (C2a) of the composite (S2C2a) using composite (S1C1) to provide composite (S1C1C2aS2);

or (2-ii) applying at least one coating composition (C2a) to at least a part of an at least partially embossed and at least partially cured surface of composite (S1C1) and at least partially embossing the coating composition (C2a) using composite (S1C1) to provide composite (S1C1C2a);

(3-ii) optionally applying a substrate (S2) to at least a part of the surface, formed by coating composition (C2a), of the composite (S1C1C2a) to give a composite (S1C1C2aS2);

and (4) at least partially curing the at least partially embossed coating composition (C2a) optionally applied to a substrate (S2) which throughout the duration of the at least partial curing is in contact with the composite (S1C1) to provide a composite (S1C1C2) or (S1C1C2S2);

and (5-i) optionally removing composite (C2S2) within the composite (S1C1C2S2) from the composite (S1C1) to restore the composite (S1C1) provided in step (1);

or (5-ii) optionally removing coating (C2) within the composite (S1C1C2) from the composite (S1C1) to restore the composite (S1C1) provided in step (1);

wherein a coating composition (C1a) used for producing the at least partially embossed and at least partially cured coating (C1) of the composite (S1C1) used in step (1) and restored in step (5-i) or step (5-ii) is a radiation-curable coating composition, comprising (a) 5 to 45 weight % of at least one crosslinkable polymer and/or oligomer,
(b) 40 to 95 weight % of at least one reactive diluent,
(c) 0.01 to 15 weight % of at least one photoinitiator, and
(d) 0 to 5 weight % of at least one additive;

where (i) the stated total amounts of the components (a), (b), (c), and (d) are each based on the total weight of the coating composition (C1a), and (ii) the total amounts of all components present in the coating composition (C1a) add up to 100 weight %;

wherein the at least one crosslinkable polymer and/or oligomer (a) comprises a total amount of at least 25 weight % based on the total weight of all crosslinkable polymer and/or oligomer comprised in the coating composition (C1a), of at least one silicone (meth) acrylate oligomer.

2. The method according to claim 1, wherein the radiation-curable coating composition (C1a) comprises 50 to 95 weight %, or 50 to 85 weight %, or 50 to 83 weight %, of at least one reactive diluent, based on the total weight of the coating composition (C1a).

3. The method according to claim 1, wherein the embossed structure to be transferred is a microstructure and/or nanostructure.

4. The method according to claim 1, wherein at least one adhesive is applied to the other surface of the substrate (S2) not to be coated with coating composition (C2a).

5. The method according to claim 1, wherein removing composite (C2S2) from the composite (S1C1) comprises the following steps:

5-i-a) applying at least one adhesive layer (AL) on the surface of the substrate (S2) not being in contact with the at least partially embossed coating (C2) providing a composite (S1C1C2S2AL);

5-i-b) optionally, at least partially attaching the composite (S1C1C2S2AL) to an object (O1);

5-i-c) removing composite (S1C1) from the composite (C2S2AL) optionally at least partially attached to an object (O1), or vice versa;

or 5-ii-a) applying at least one adhesive layer (AL) on at least a part of the unstructured surface of the at least partially embossed coating (C2) providing a composite (S1C1C2AL);

5-ii-b) optionally, at least partially attaching the composite (S1C1C2AL) to an object (O1);

5-ii-c) removing composite (S1C1) from the composite (C2S2AL) optionally at least partially attached to an object (O1), or vice versa.

6. The method according to claim 1, wherein the composite (S1C1) provided in step (1) is used as embossing mold (e2) of an embossing tool (E2) to transfer the embossed structure of the coating (C1) as embossed structure to the coating composition (C2a) in step (3-i), and in steps (2-ii) and (3-ii), wherein the mirror image of the structured surface of the coating (C1) of composite (S1C1) used as embossing mold (e2) is embossed into the surface of the at least partially embossed and at least partially cured coating (C2) optionally applied on a substrate (S2).

7. The method according to claim 1, wherein the substrate (S1) is a film web.

8. The method according to claim 1, wherein the composite (S1C1) that is used in step (3-i) and steps (2-ii) and (3-ii) is reusable and can be used repeatedly for transferring at least one embossed structure when step (5-i) or (5-ii) of the method is carried out.

9. The method according to claim 1, wherein the composite (S1C1) provided in step (1) is obtained by (6) applying the radiation-curable coating composition (C1a) to at least a part of the surface of a substrate (S1) to provide a composite (S1C1a);

(7) at least partially embossing the coating composition (C1a) applied at least partly to the surface of the substrate (S1) by means of at least one embossing tool (E1) comprising at least one embossing mold (e1);

(8) at least partially curing the at least partially embossed coating composition (C1a) applied at least partially to a substrate (S1) which throughout the duration of the at least partial curing is in contact with the at least one embossing mold (e1) of the embossing tool (E1); and (9) removing the composite (S1C1) from the embossing mold (e1) of the embossing tool (E1) to provide the at least partially embossed and at least partially cured composite (S1C1), or vice versa.

10. The method according to claim 1, wherein the coating composition (C1a) comprises a total amount of at least 50 weight % based on the total weight of all crosslinkable polymer and/or oligomer comprised in the coating composition (C1a), of at least one silicone (meth)acrylate oligomer.

11. The method according to claim 1, wherein the coating composition (C1a) comprises as reactive diluent free-radically polymerizable monomers.

12. The method according to claim 1, wherein the coating composition (C1a) comprises at least one reactive diluent selected from the group consisting of hexane diol diacrylate and compounds comprising at least two structural units which may be different from each other or at least partially identical, of the general formula (I)

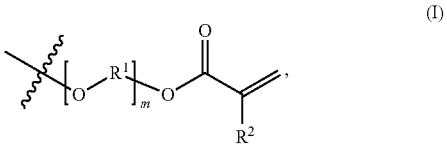

wherein
- the radicals R1, independently of each other, are C2-C8 alkylene groups,
- the radicals R2, independently of each other, are H or methyl, and
- the parameters m, independently of each other, are an integral number in a range from 1 to 15, but with the proviso that in at least one of the structural units of the formula (I) the parameter m is at least 2.

13. The method according to claim 1, wherein the coating composition (C1a) comprises a total amount of 50 to 85 weight % based on the total weight of the coating composition (C1a), of the at least one reactive diluent.

14. The method according to claim 1 wherein the photoinitiator comprised in the coating composition (C1a) is selected from the group consisting of diphenyl (2,4,6-trimethylbenzoyl) phosphine oxide, ethyl (2,4,6-trimethylbenzoyl)phenylphosphinate, phenylbis (2,4,6-trimethylbenzoyl)-phosphine oxide, benzophenone, 1-benzoylcyclohexan-1-ol, 2-hydroxy-2,2-dimethylacetophenone and 2,2-dimethoxy-2-phenylacetophenone and mixtures thereof.

15. The method according to claim 1, wherein the embossed structure to be transferred is a microstructure and/or nanostructure having a structure width in a range from 10 nm to 500 μm.

16. The method according to claim 1, wherein the embossed structure to be transferred is a microstructure and/or nanostructure having a structure height in a range from 10 nm to 500 μm.

* * * * *